United States Patent
Zhu

(10) Patent No.: US 6,762,618 B1
(45) Date of Patent: Jul. 13, 2004

(54) VERIFY SCHEME FOR A MULTI-LEVEL ROUTING STRUCTURE

(75) Inventor: Jinghui Zhu, San Jose, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 98 days.

(21) Appl. No.: 10/269,439

(22) Filed: Oct. 11, 2002

(51) Int. Cl.[7] ............................................ H03K 19/173
(52) U.S. Cl. .............................. 326/16; 326/9; 326/38; 326/41
(58) Field of Search ................................ 326/37–41, 9, 326/16

(56) References Cited

U.S. PATENT DOCUMENTS

| | | | | | |
|---|---|---|---|---|---|
| 4,780,627 A | * | 10/1988 | Illman | .......................... | 326/16 |
| 6,127,838 A | * | 10/2000 | Sachdev | ...................... | 326/16 |

* cited by examiner

*Primary Examiner*—Anh Q. Tran
(74) *Attorney, Agent, or Firm*—MacPherson Kwok Chen & Heid, LLP

(57) ABSTRACT

An efficient verify scheme for a multi-level routing structure is provided. For example, a two-level routing structure may have a second-level routing structure whose switch matrix is either partially or fully populated. Depending upon the type of fuse population, a test signal is applied either to the input side or the output side of the fuses in the second switch matrix.

21 Claims, 21 Drawing Sheets

| 3B-1 | 3B-2 | 3B-3 | 3B-4 |
|---|---|---|---|
| 3B-5 | 3B-6 | 3B-7 | 3B-8 |

*FIG. 3B*

VERIFY SCHEME FOR A MULTI-LEVEL ROUTING STRUCTURE

FIELD OF INVENTION

This invention relates to verification of fuse/pass transistor combinations in routing structures, and more particularly to the verification of these combinations in multi-level routing structures.

BACKGROUND

Programmable interconnect devices permit a user to programmably route signals between pins of the device. For example, Lattice Semiconductor currently manufactures an ispGDX® and ispGDXV® family of programmable interconnect devices having a non-volatile $E^2CMOS®$ in-system-programmable crossbar switch matrix for programmable switching, interconnect, and jumper functions. In an ispGDXV® device, each pin is associated with an input/output (I/O) circuit that programmably couples other I/O circuits through a routing structure that may be denoted as a global routing pool (GRP). Another programmable interconnect circuit is described in "Block Oriented Architecture for a Programmable Interconnect Circuit," U.S. Ser. No. 10/022,464, filed Dec. 14, 2001, the contents of which are hereby incorporated by reference in their entirety. In this programmable interconnect circuit, the I/O circuits are grouped into block to form a "block-oriented" architecture that contrasts with conventional "pin-oriented" architectures for a programmable interconnect circuit. In a pin-oriented architecture, the routing structure addresses each I/O circuit independently, whereas in a block-oriented architecture, the I/O circuits within a block are not addressed independently by the routing structure. By organizing the I/O circuits into blocks, the routing structure may be arranged in a two-level organization as described in "Multi-Level Routing Structure for a Programmable Interconnect Circuit," U.S. Ser. No. 10/023,053, filed Dec. 14th, 2001, the contents of which are hereby incorporated by reference in their entirety. In addition, the routing structure may be subdivided into a data-path routing structure and a control-path routing structure as described therein.

Regardless of whether a routing structure is one level or two-level, each routing structure functions by connecting a given input conductor to a given output conductor through a pass transistor or pass gate. Each pass gate is controlled by a memory cell (the fuse) and is either conducting or non-conducting depending upon the bit stored in the memory cell. For example, should the memory cell be storing a "1," its corresponding pass gate may be conducting. Conversely, should the memory cell be storing a "0," the corresponding pass gate may be nonconducting. Thus the state of the memory cell controls whether the corresponding input and output conductors are coupled. To function properly, each pass gate in a routing structure must be able to pass or block both a "0" and a "1." Before shipping a routing-structure-equipped device, a manufacturer will typically test the routing structure using a "verify" scheme. For example, the input conductor coupled to the pass transistor carries a test signal and the output signal carried by the output conductor coupled to the pass transistor is tested for both states of the corresponding memory cell. During verification, the output signal may be pulled to the inverted state of the test signal through a "weak" inverter. Because the output signal is only weakly pulled to the inverted state of the test signal, the output signal should equal the test signal when the pass gate is activated. If the pass gate is nonconducting, the output signal should equal the inverted test signal as pulled by the weak buffer.

For example, assume that a pass transistor is configured such that it conducts when its memory cell stores a "1" and is non-conducting when its memory cell stores a "0." During verification, the test signal may be set to "0" and the output signal from the pass transistor tested for both states of the memory cell. When the memory cell stores a "1," the output signal should be a "0" such that the pass gate can "pass a 0." Conversely, when the memory cell stores a "0," the output signal should be a "1" such that the pass gate can "block a 0." Similarly, when the test signal is "1," the pass gate should be able to both "block a 1" and "pass a 1," depending upon the state of the memory cell. Although a user of a routing-structure-equipped device is assured that the manufacturer has already verified its operation, each user must be assured that the programming equipment used to program the routing structure and its associated cabling are working correctly. Thus, the user will program the fuses with a test pattern, supply a known set of input signals, and verify that the desired set of output signals as determined by the programming is received. Thus, both the manufacturer and user will typically verify operation of the routing structure.

Two-level routing structures such as disclosed in U.S. Ser. No. 10/023,053 require new approaches to verify schemes, particularly with respect to testing the second level routing structure efficiently. Accordingly, there is a need in the art for improved verify schemes for routing structures, particularly two-level routing structures.

SUMMARY

In accordance with a first aspect of the invention, a multi-level routing structure is provided having a user mode and a verify mode using a test signal. The multi-level routing structure includes a first-level routing structure that, in the user mode, receives a first set of input signals and routes this set of signals through a first switch matrix to form a first set of output signals. In the verify mode, the first-level routing structure routes the test signal, rather than the first set of input signals, through the first switch matrix to form the first set of output signals. A second-level routing structure, during the user mode, receives the first set of output signals and routes these signals through a switch matrix into a second set of output signals. In the verify mode, the second-level routing structure routes the test signal, rather than the first set of output signals, through the second switch matrix to form the second set of output signals. A sense gate is operable in the verify mode to receive the first set of output signals or the second set of output signals, the sense gate being configured to weakly invert the test signal and combine the inverted test signal with the received set of output signals to form a set of verification signals.

In accordance with another aspect of the invention, a multi-level routing structure is provided having a user mode and a verify mode using a test signal. The multi-level routing structure includes a first-level routing structure that receives a first set of input signals and routes the received signals through a first switch matrix to form a first set of output signals during the user mode. In the verify mode, the first-level routing structure routes the test signal, rather than the first set of input signals, through the first switch matrix to form the first set of output signals. A second-level routing structure, during the user mode, receives the first set of output signals and routes these signals through a switch matrix into a second set of output signals. In the verify mode, the second-level routing structure routes the test signal through the second switch matrix to form a third set of output signals, wherein the size of the third set of output signals equals the size of the first set of output signals. A sense gate is operable in the verify mode to receive the first set of output signals or the third set of output signals, the sense gate being configured to weakly invert the test signal and combine the inverted test signal with the received set of output signals to form a set of verification signals.

The invention will be more fully understood upon consideration of the following detailed description, taken together with the accompanying drawings.

BRIEF DESCRIPTION OF THE DRAWINGS

FIG. 3b illustrates a fusing pattern for the first-level-data-path routing structure of FIG. 3a.

FIG. 3c illustrates a fusing pattern for the second-level-data-path routing structure of FIG. 3a.

FIG. 4b illustrates a fusing pattern for the second-level-control-path routing pool structure of FIG. 4a.

DETAILED DESCRIPTION

Figure 1:
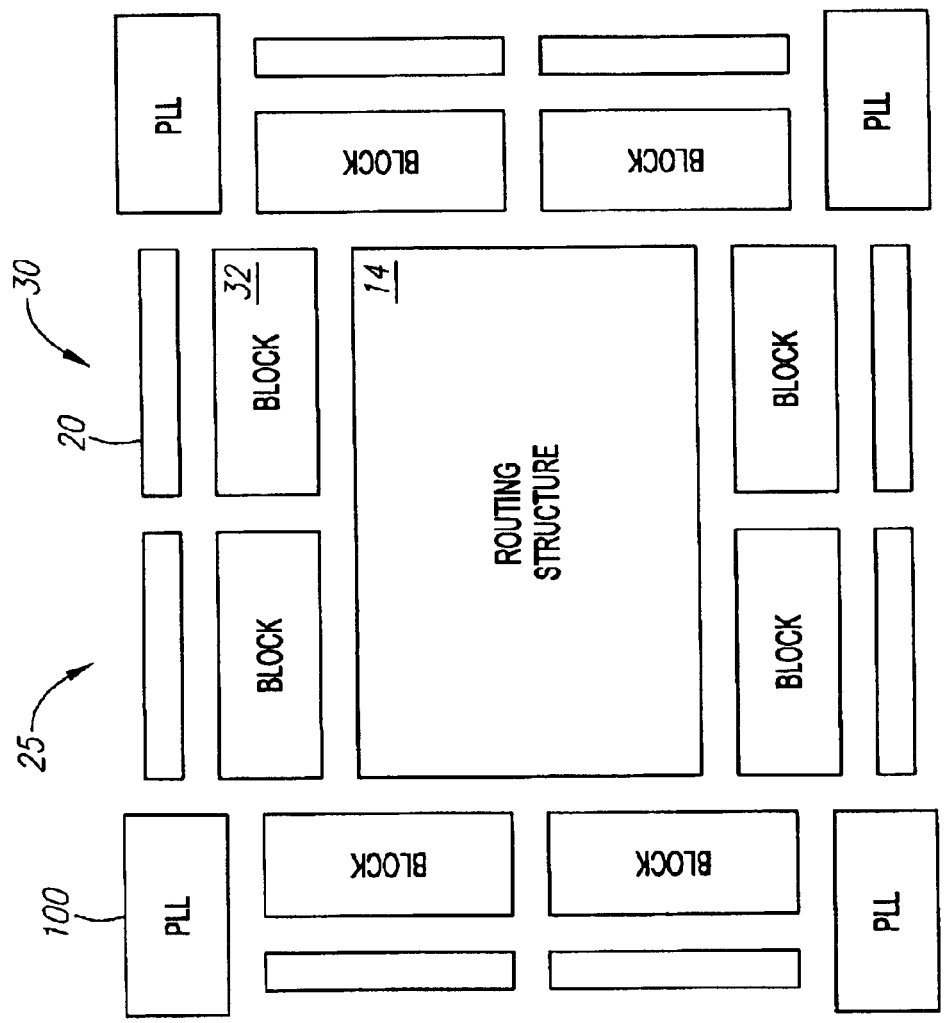
FIG. 1 illustrates a block-oriented architecture for a programmable interconnect circuit.
Figure 2:
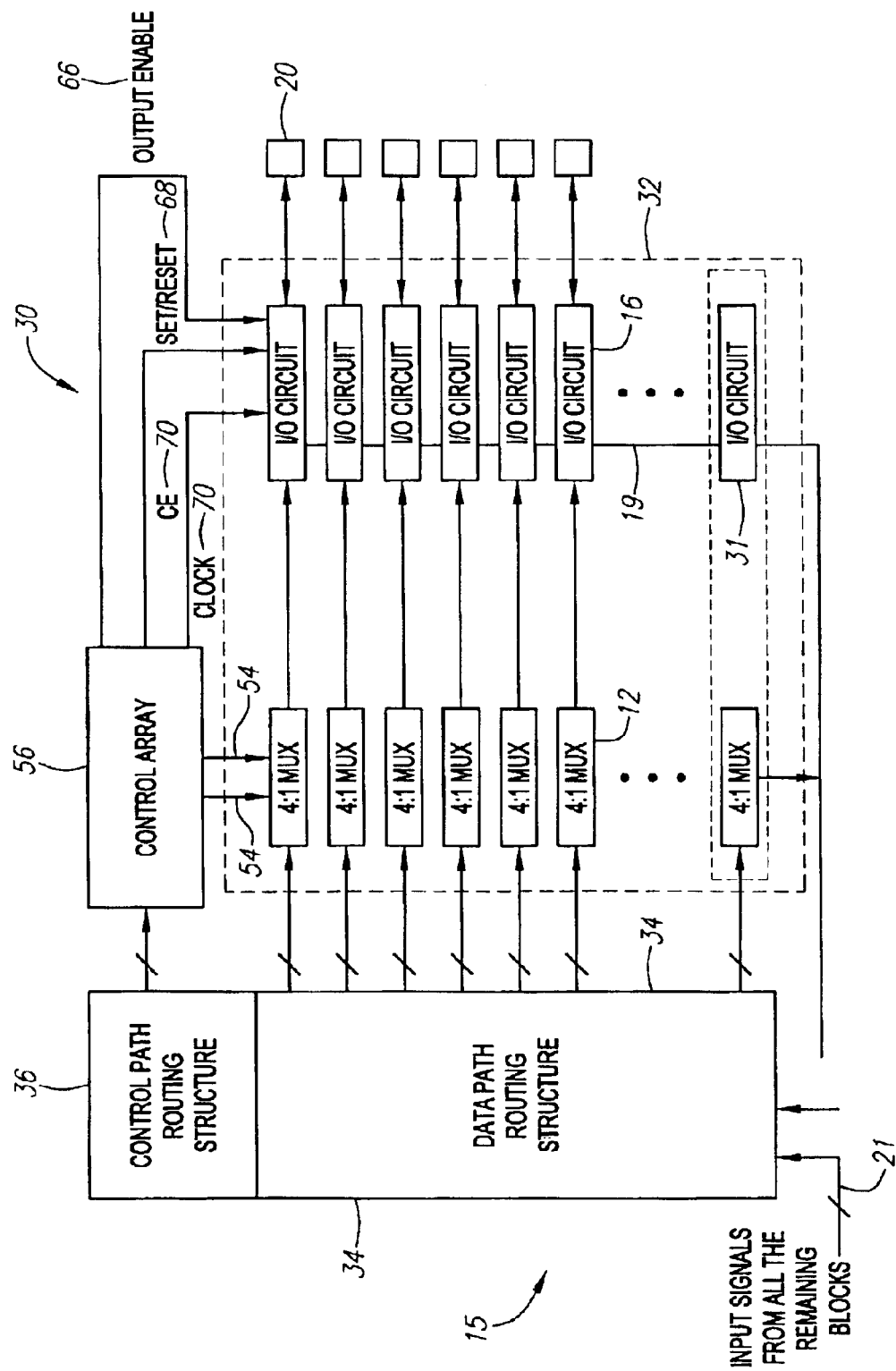
FIG. 2 illustrates further aspects of the block-oriented architecture of FIG. 1.

The present invention will be described with respect to a programmable interconnect device having a block-oriented programmable interconnect architecture. However, the verify scheme of the present invention is broadly applicable to any device having a routing structure. Referring now to FIGS. 1 and 2, a programmable interconnect device 25 having a block-oriented programmable interconnect architecture 30 is illustrated. Each I/O block 32 contains an integer number X of I/O circuits 16 that associate with their own routing structure 15. In general, integer X is arbitrary as any number of I/O circuits 16 may be assigned to an I/O block 32. However, because bus-switching applications typically route binary signals in groups of 8 (1 byte) or 16 (2 bytes), assigning 16 I/O circuits per I/O block 32 is particularly convenient. Each I/O circuit 16 may be contained with an I/O cell 31, which also includes a 4:1 multiplexer 12 for selecting data signal inputs for its I/O circuit 16 (for clarity, only one I/O cell 31 is illustrated in FIG. 2). In FIG. 1, the routing structures 15 are collectively denoted as a single routing structure 14. Referring again to FIG. 2, each I/O circuit 16 may receive input signals from its pin 20. These input signals may comprise data signals that will ultimately be routed to other pins 20. Alternatively, these input signals may comprise control signals for controlling, for example, 4:1 multiplexers 12 or registers within I/O circuit 16.

Programmable interconnect device 25 is programmable because of its association with a programmable memory (not illustrated), which is typically non-volatile but may be implemented as a volatile memory if desired. A user may program memory elements within the programmable memory to desired logic levels. These memory elements then control programmable elements such as fuse points, multiplexers, and switches within interconnect device 25 so as to effect a desired mode of operation. The programmable memory is preferably in-system programmable, such that a user may change the programming after the interconnect device has been installed in a system.

Each I/O block 32 may receive signals from two independent routing structures contained within routing structure 15: a data-path routing structure 34 for programmably routing data signals, and a second control-path routing structure 36 for programmably coupling control signals to a control array 56, which in turn provides product-term control signals to its I/O block 32. Although data-path routing structure 34 and control-path routing structure 36 are independent, such independence may be conceptual only in that the data-path routing structure 34 and control-path routing structure 36 may be combined into a single routing structure. For example, a single switch matrix may accommodate both data and control signals in such a routing structure. However, the fuse patterns within the switch matrix may differ according to whether data signals or control signals are being routed.

Figure 3A:
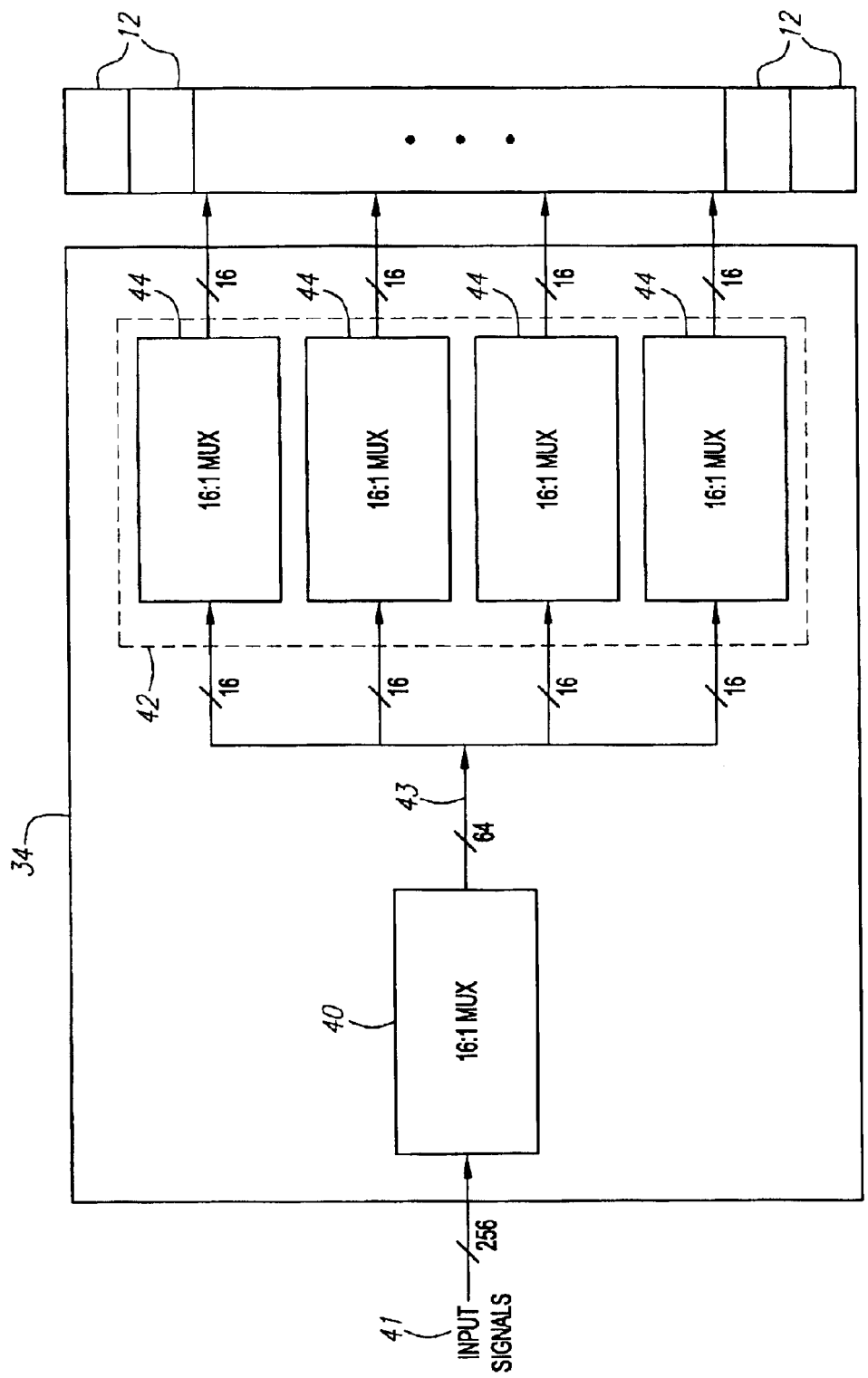
FIG. 3a illustrates a two-level-data-path routing structure for a 256 pin device.

Arranging the I/O circuits 16 into I/O blocks 32 allows each data-path routing structure 34 and control-path routing structure 36 to be arranged in a two-level organization. For example, turning now to FIG. 3a, data-path routing structure 34 may comprise a first-level-data-path routing structure 40 and a second-level-data-path routing structure 42. First-level-data-path routing structure 40 may receive input signals 41 originating from pins 20 corresponding to all I/O blocks 32 of interconnect device 25. Each pin 20 associates with its own I/O circuit 16. Thus, if they are 256 I/O circuits 16 corresponding to 256 pins 20, first-level-data-path routing structure 40 may receive 256 I/O signals. To reduce the fuse count, first-level-data-path routing structure's 40 switch matrix (discussed further with respect to FIG. 3b) may be only partially populated. As a result, first-level-data-path routing structure 40 may form an M:1 multiplexer for each output signal carried from first-level-data-path routing structure 40 on bus 43, where M corresponds to the ratio of the total number of I/O signals 41 feeding first-level-data-path routing structure 40 to the total number of I/O circuits 16 within the associated I/O block 32. Accordingly, given that each I/O block 32 has a fixed number X of I/O circuits, the total number of I/O signals 41 feeding first-level-data-path routing structure 40 becomes (N*X), where N is the total number of I/O blocks 32 in programmable interconnect device 25. The integer M then equals (N*X)/X, which equals N, the total number of I/O blocks 32 in programmable interconnect device 25. Thus, the multiplexer formed for each output signal on bus 43 from first-level-data-path routing structure 40 depends upon the number of I/O blocks 32 used in programmable interconnect device 25. If there are 16 I/O blocks 32, the fuse pattern within first-level-data-path routing structure 40 forms a 16:1 multiplexer for each output signal carried on output bus 43. Because the 4:1 multiplexer 12 coupled to each I/O circuit 16 within an I/O cell 31 receives 4 input signals, an I/O block 32 having 16 I/O circuits will receive 64 input signals. In such an embodiment, the first-level-data-path routing structure 40 will thus have a 64-bit wide output bus 43.

Figures 1, 3B:
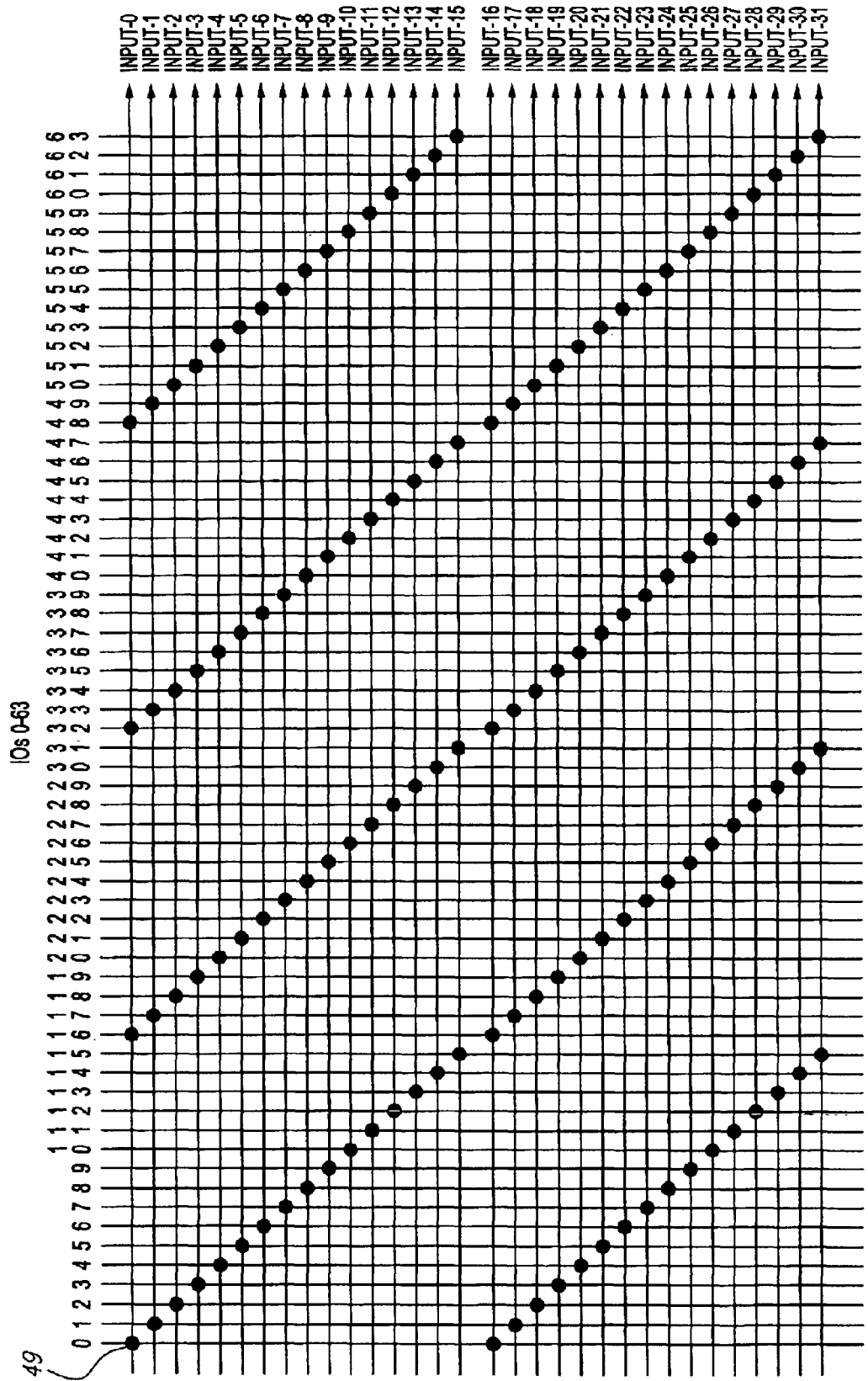
Figures 2, 3B:
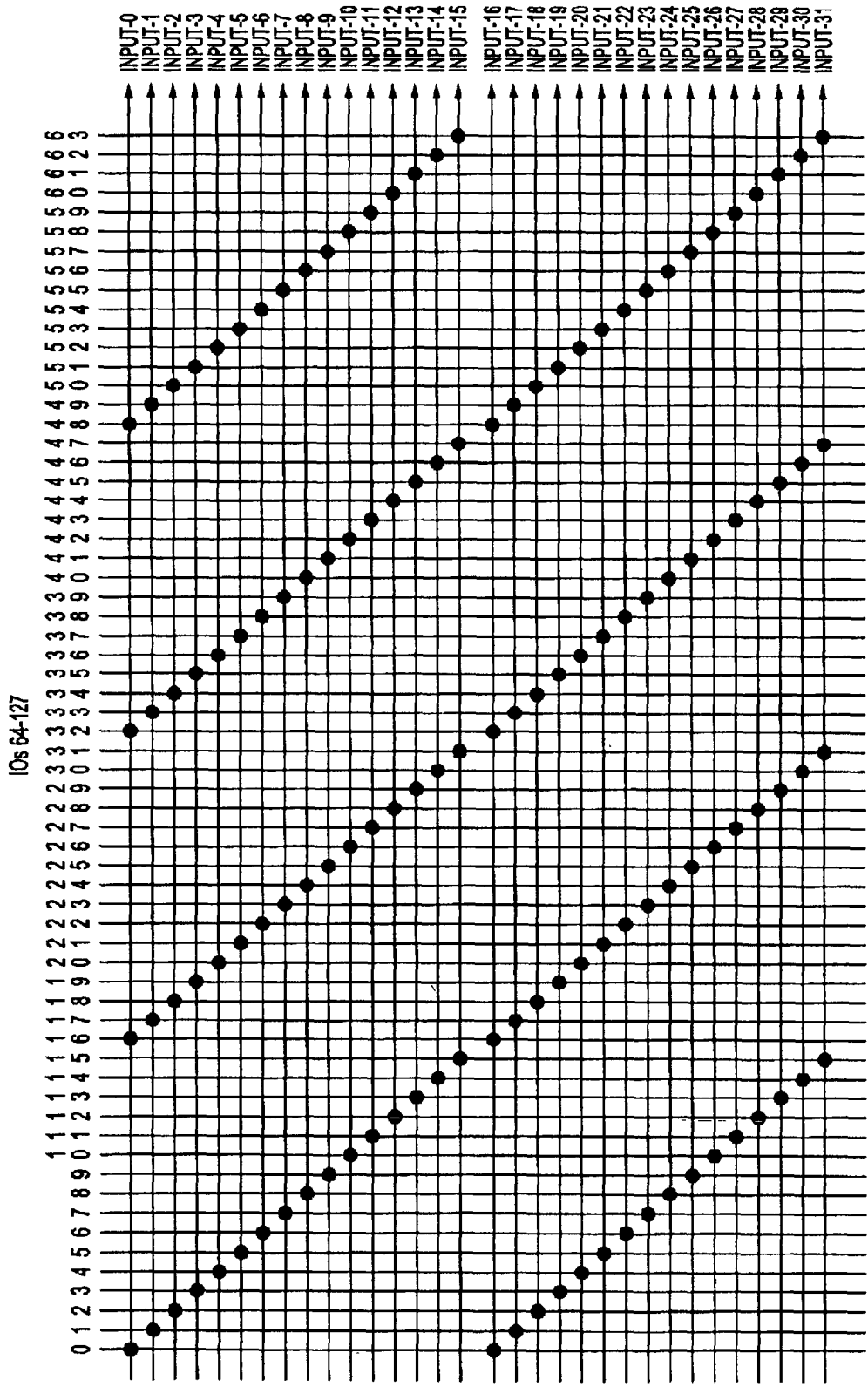
Figures 3, 3B:
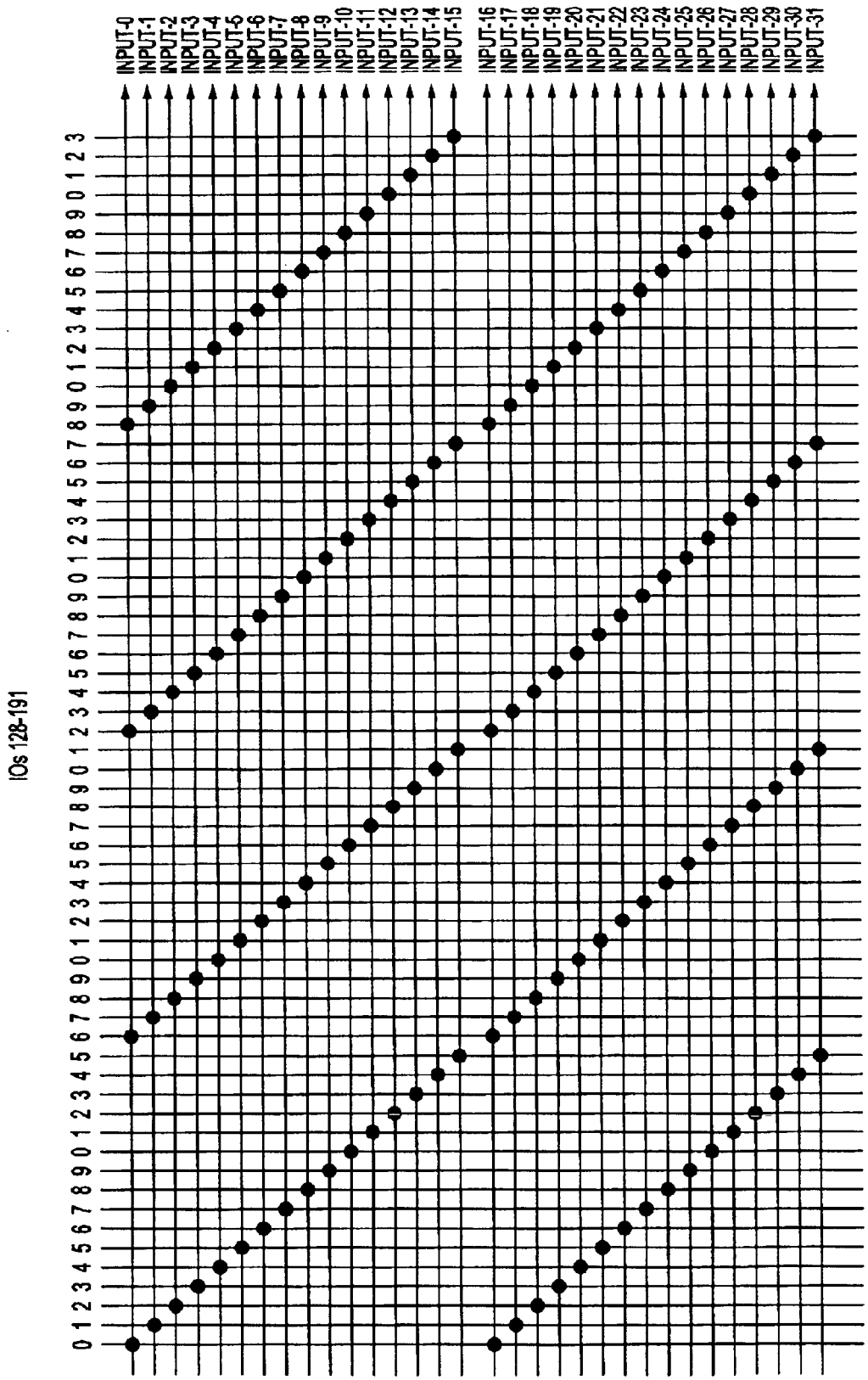
Figures 3, 3B, 4:
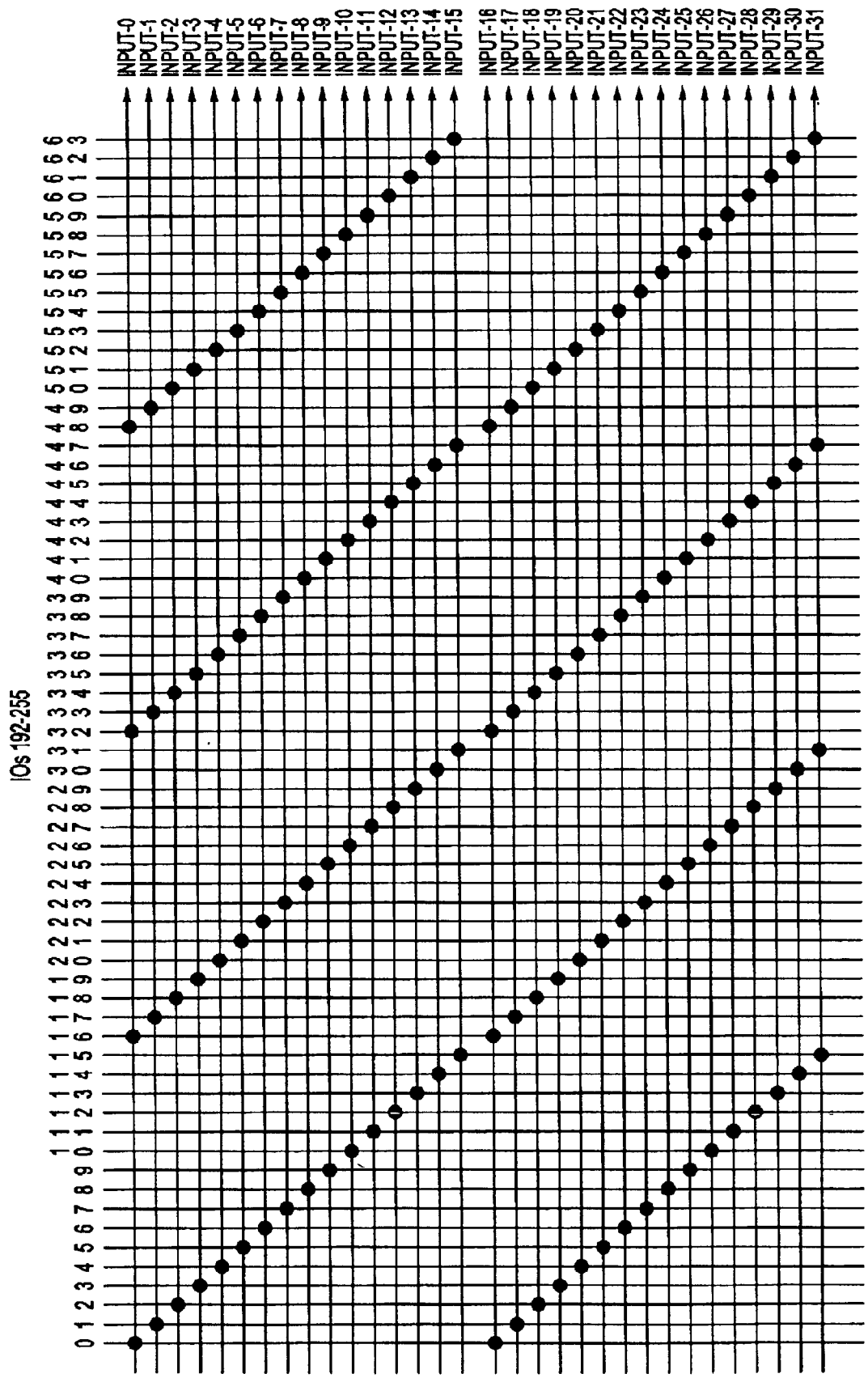

FIG. 3b illustrates the partially-populated fusing pattern for the switch matrix in first-level-data-path routing structure 40 for a 256 pin programmable interconnect device 25 having 16 I/O blocks 32, in which each I/O block comprises 16 I/O circuits 16. At each darkened intersection 49, a one-bit memory cell, which may be an electrically erasable in-system-programmable read-only memory cell, couples to a pass transistor to programmably fuse a data-path routing structure input signal 41 to an output signal will be carried on output bus 43. Thus, first-level-data-path routing structure 40 implements static routing. As discussed with respect to FIG. 3a, first-level-data-path routing structure 40 may receive 256 input signals 41 (numbered 0 through 255 in FIG. 3b) and routes these received signals into 64 output signals (numbered 0 through 63 in FIG. 3b) that are carried on bus 43. First-level-data-path routing structure 40 is 4-way routed in that each input signal 41 has four different paths it may take to reach the output as follows. Consider input signal number 0 illustrated in FIG. 3b-1 and 3b-5. This input may be fused at the appropriate intersections 49 to form output signals numbers 0, 17, 32, and 48, thereby providing four ways for input signal number 0 to reach the output.

To permit increased flexibility in signal routing to any given I/O circuit 16, a second-level-data-path routing structure 42 couples output signals on bus 43 from first-level-data-path routing structure 40 to its I/O block 32. The switch matrix for the second level-data-path routing structure 42 may be fully populated and fused by a non-volatile memory bank. The second-level-data-path routing structure 42 may be conceptually organized into groups of X signals corresponding to the number X of I/O circuits 16 assigned to any given I/O block 32. For an X=16 architecture, the resulting second-level-data-path routing structure 42 is organized into four blocks of switch matrices 44a through 44d as shown in FIGS. 3c-1 through 3c-4, where each switch matrix responds to a consecutive group of 16 signals from first-level-data-path routing structure 40. Each block 44 provides 16 signals as data inputs for four 4:1 multiplexers 12 of the I/O cell 31 (FIG. 2). The resulting fully-populated switch matrices blocks 44a through 44d for second-level-data-path routing structure 42 of a 256 pin device 25 having 16 I/O blocks 32 of sixteen I/O circuits 16 are illustrated in FIG. 3c. It will be appreciated that a partially-populated switch matrix could be implemented in second-level-data-path routing structure 42 at the cost of routing flexibility.

Figure 4A:
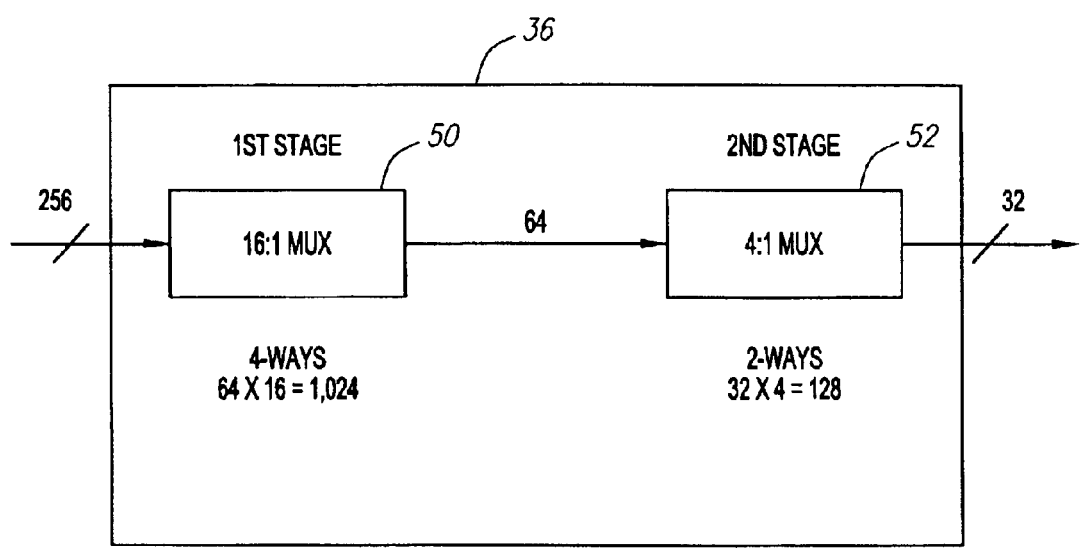
FIG. 4a illustrates a two-level-control-path routing structure.

A similar two-level organization may be used for control-path routing structure 36 such that it comprises a first-level control-path routing structure 50 and a second-level-control-path routing structure 52 as shown in FIG. 4a. For a device having 256 I/O circuits 16, first-level-control-path routing structure 50 may receive 256 different input signals. The partially-populated switch matrix (not illustrated) for first-level-control-path routing structure 50 is fused as discussed with respect to first-level-data-path routing structure 40 such that each output of first-level-control-path routing structure 50 forms an M:1 multiplexer corresponding to the total number M of I/O blocks 32. In an embodiment where programmable interconnect device 25 has 16 I/O blocks 32, first-level-control-path routing structure 50 thus forms a 16:1 multiplexer for each of its 64 output signals. Accordingly, first-level-control-path routing structure 50 may have a similar fuse pattern to that discussed with respect to FIG. 3b for first-level-data-path routing structure 40. Both first-level-control-path routing structure 50 and second-level-control-path routing structure 52 may be fused according to configuration data stored in a non volatile memory such as an E$^2$CMOS® memory bank.

Figure 4B:
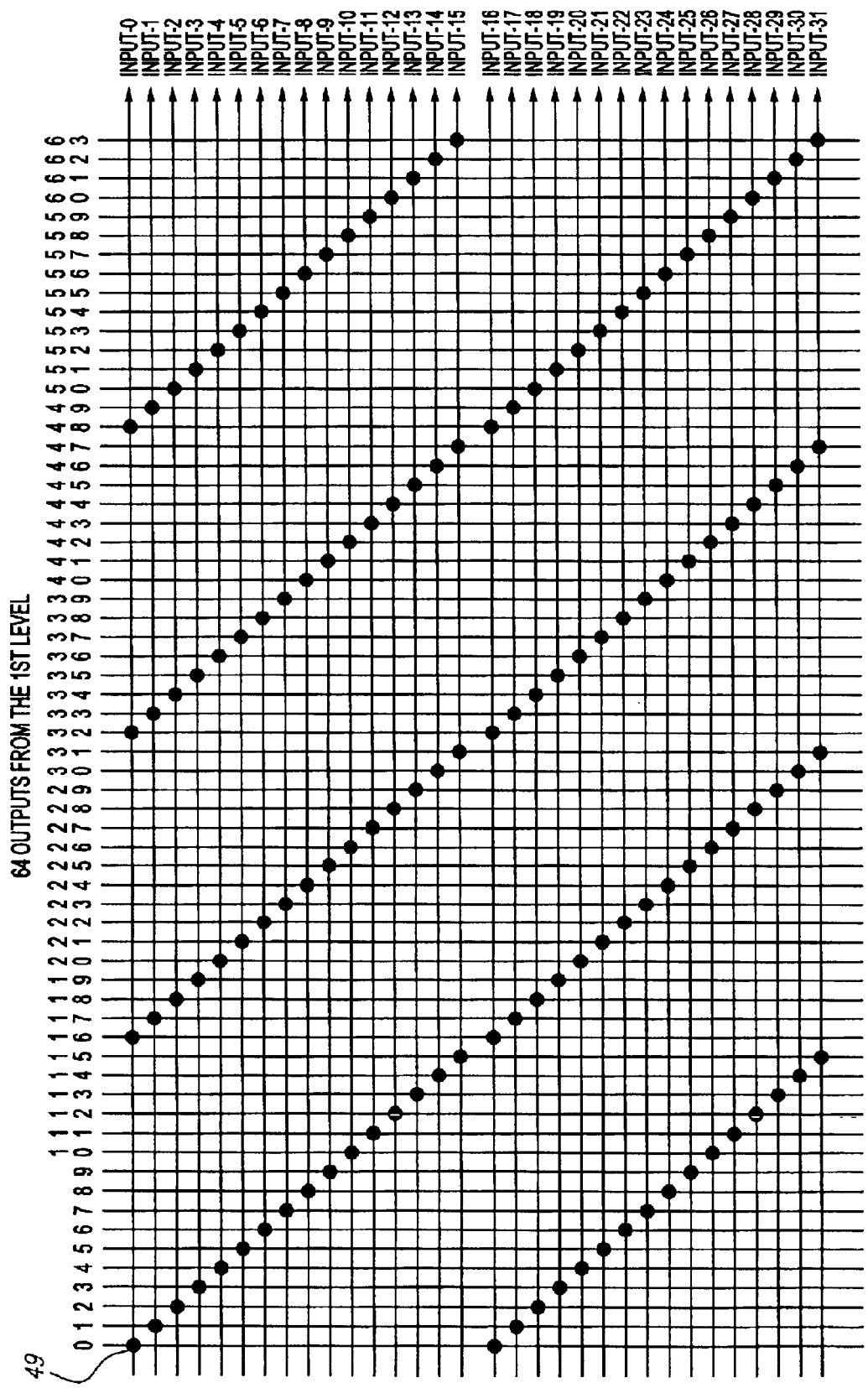
Figure 5:
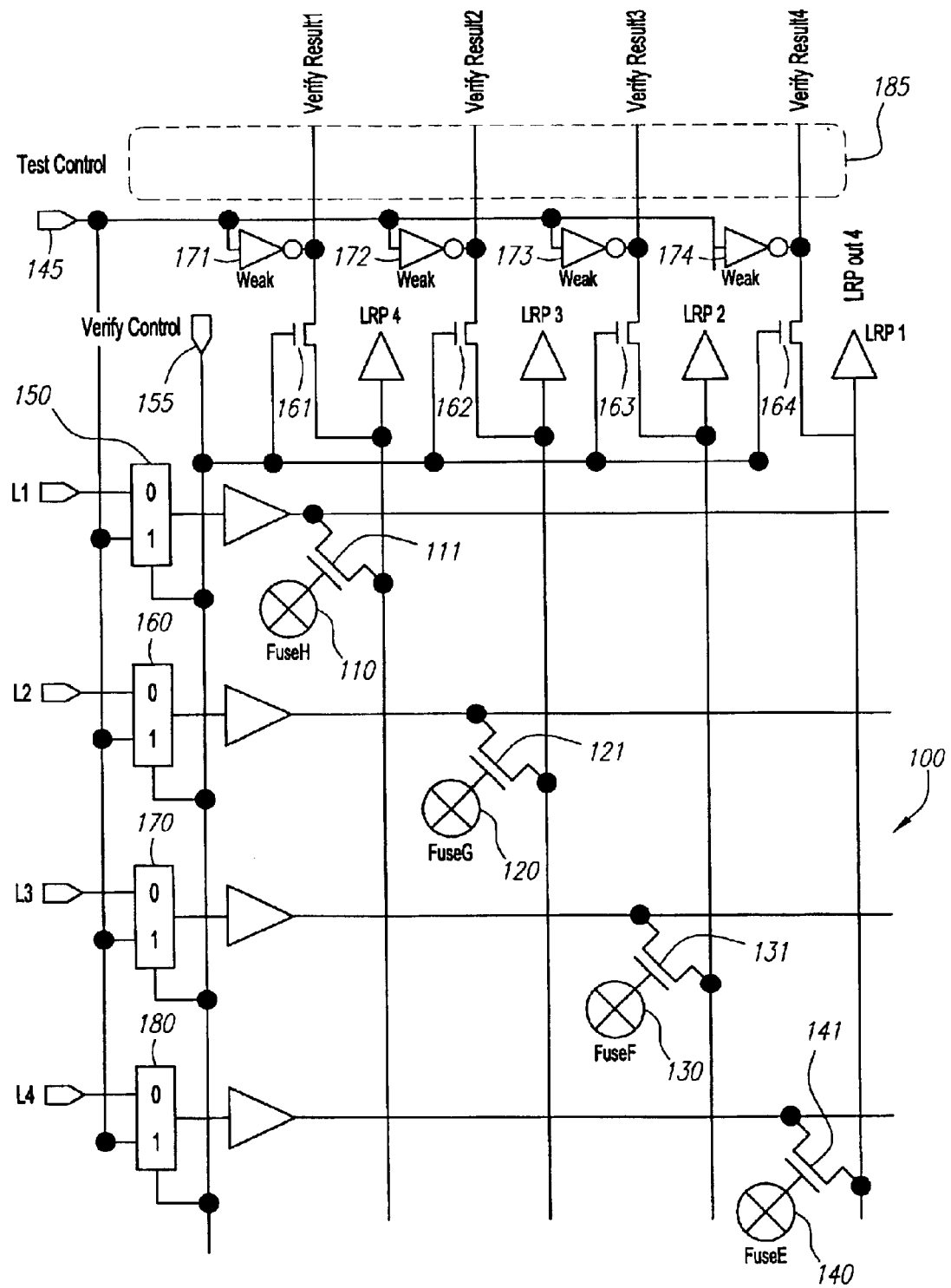
FIG. 5 illustrates a verify circuit for a fully-populated second-level routing structure according to one embodiment of the invention.
Figure 6:
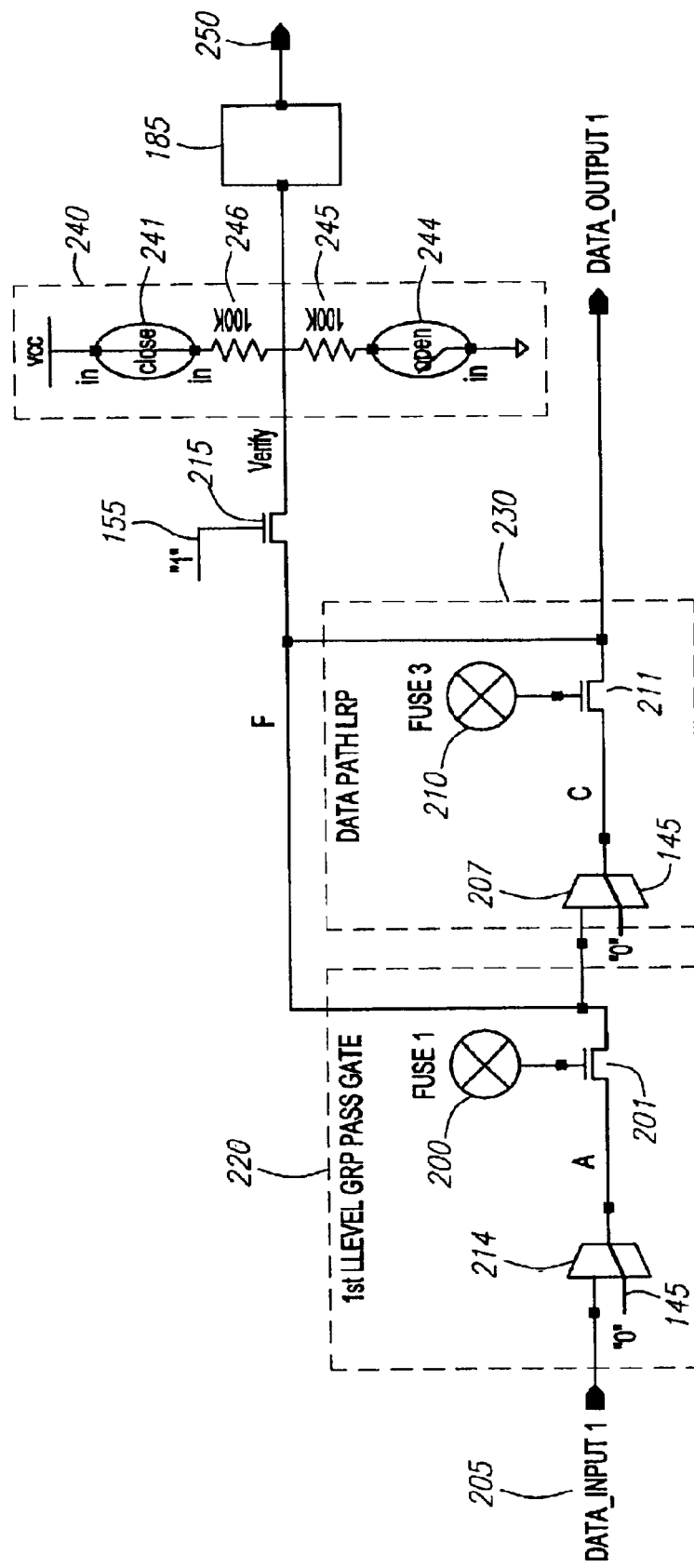
FIG. 6 illustrates a verify circuit for a two-level routing structure according to one embodiment of the invention.
Figure 7:
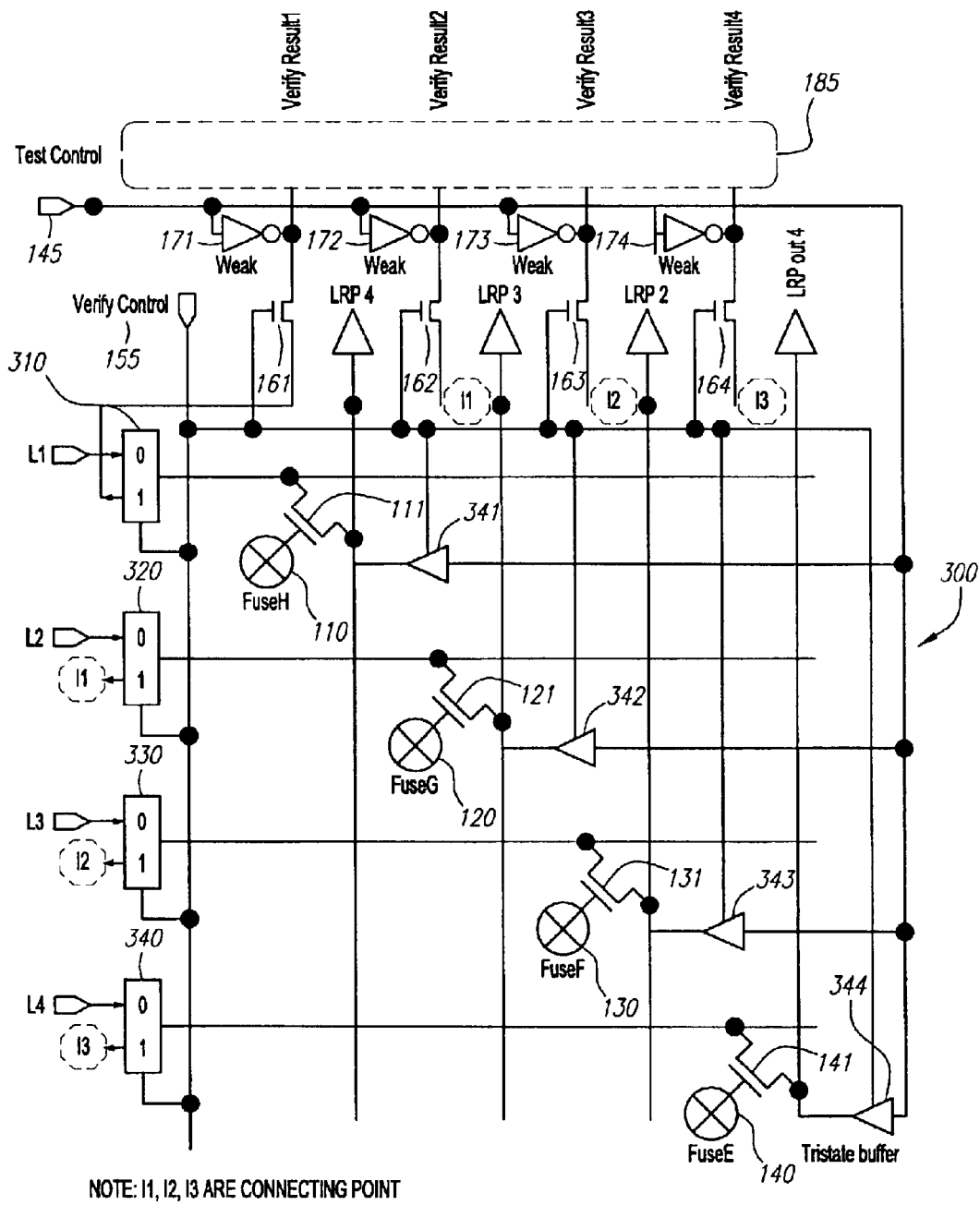
FIG. 7 illustrates a verify circuit for a partially-populated second-level routing structure according to one embodiment of the invention.
Figure 8:
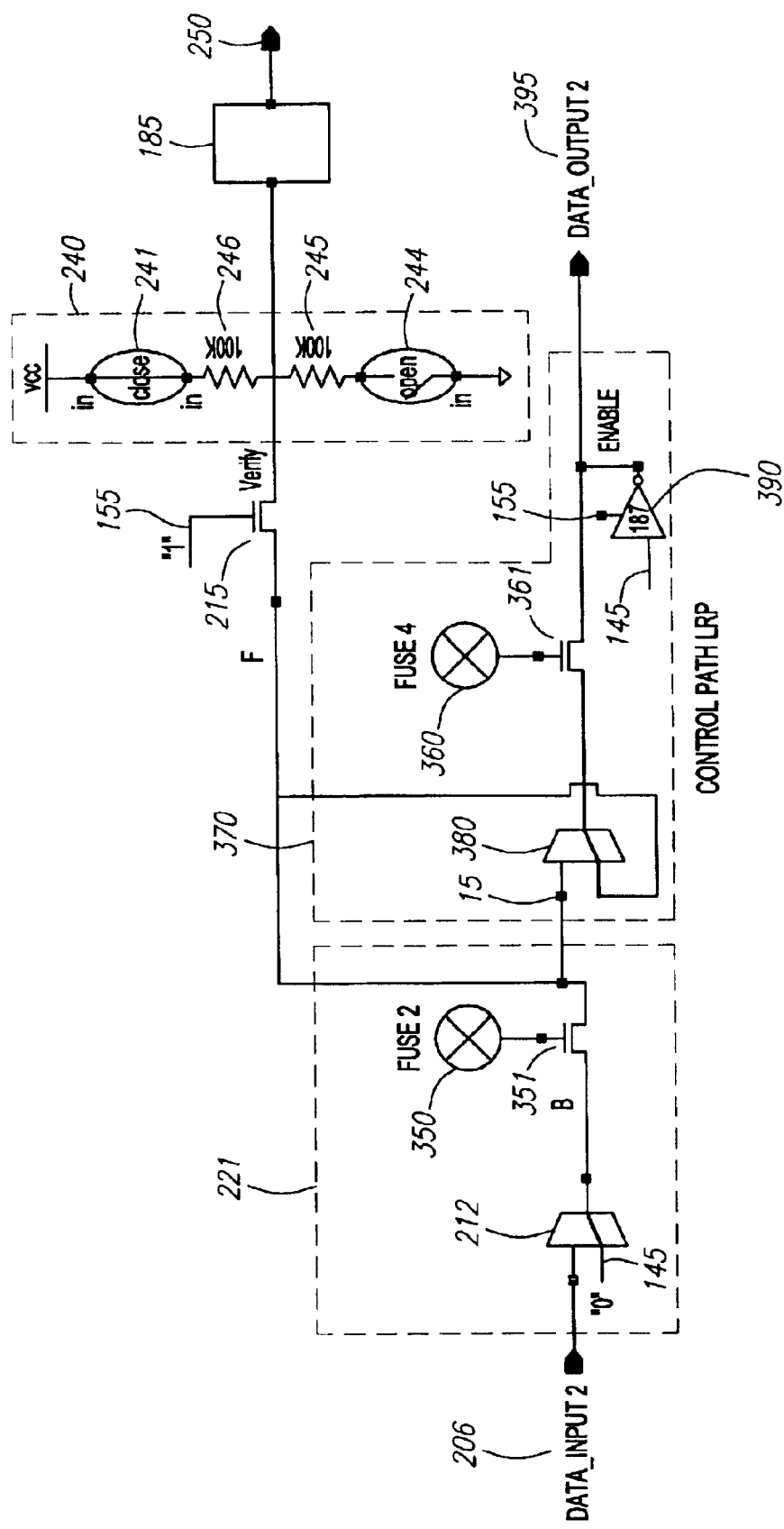
FIG. 8 illustrates a verify circuit for a two-level routing structure according to one embodiment of the invention.

However, unlike second-level-data-path routing structure 42, there is no need for second-level-control-path routing structure 52 to have a fully-populated switch matrix if an assumption is made about the use of the resulting device. For example, consider the multiplexer select signals 54 required to control the set of 4:1 multiplexers 12 for each I/O block 32. Because each 4:1 multiplexer 12 requires two multiplexer select signals, a fully independent multiplexer control structure would require 32 independent multiplexer select signals 54. However, in many applications such as bus switching, this level of independence would be wasted because the signals within a given bus are not switched independently and thus would not require independent multiplexer select signals. Grouping control signals permits the second-level-control-path routing structure 52 to comprise a partially-populated switch matrix as illustrated in FIG. 4b and fused such that it forms a 4:1 multiplexer for each of 32 output signals. Second-level-control-path routing structure 52 receives 64 output signals (numbered 0 through 63) from first-level-control-path routing structure 50 and programmably routes these signals into 32 output signals (numbered 0 through 31). Second-level-control-path routing structure 52 is two-way routed such that each input signal has two different ways it may take to reach the output. For example, input signal number 0 may be fused at the appropriate intersections 49 to form output signals numbered 0 and 16, thereby providing two ways for input signal number 0 to reach the output. It will be appreciated that the number of output signals is arbitrary and results from a trade-off between fuse count and flexibility. These same design considerations control whether second-level-control-path routing structure 52 has a fully or partially-populated switch matrix.

From the foregoing discussion, the following may be summarized regarding a two-level routing structure comprising a first-level routing structure and a second-level routing structure. The first-level routing structure receives a first set of input signals and programmably routes this first set of input signals through a first switch matrix to form a first set of output signals. The second level routing structure receives this first set of output signals and programmably routes these signals through a second switch matrix to form a second set of output signals. Each of the first and second switch matrices may be either partially or fully populated. The verify scheme of the present invention will differ depending upon whether the second switch matrix is fully or partially populated.

1. Fully-populated Second Switch Matrix

The number of signals within the set of output signals from the first-level routing structure determines the number of memory cell/pass gate combinations in the first-level routing structure that may be verified at any given time. If the switch matrix in the second level routing structure is fully populated, the set of output signals from the second-level routing structure will be the same size as the set of output signals from the first-level routing structure. Accordingly, when the second switch matrix is fully populated, the number of fuses in the second-level routing structure that may be verified at any given time is the same number as may be verified at any given time in the first-level routing structure. Given the similarity, the same verify scheme may be used for both the first-level and second-level routing structures.

Figures 3, 3B, 4, 5:
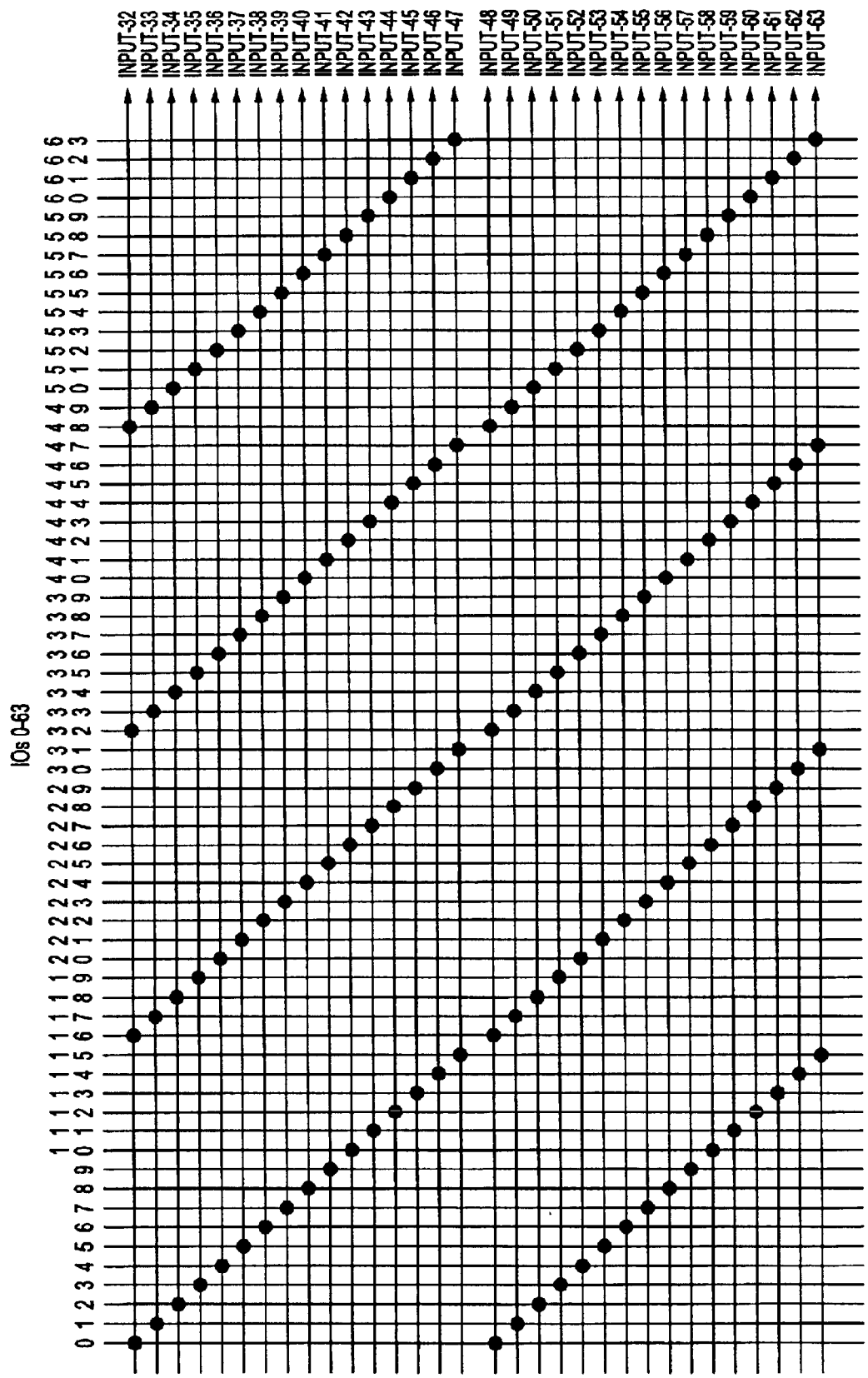

FIG. 5 illustrates the verify scheme for a second-level routing structure. Inputs L1 through L4 from a first-level routing structure may be routed through second switch matrix 100 to form second-level routing outputs LRP1 through LRP4, depending upon the programming of second switch matrix 100. For ease of illustration, only memory cells 110 through 140 are illustrated. Memory cells 110, 120, 130, and 140 control pass transistors 111, 121, 131, and 141, respectively. Because second switch matrix 100 is fully populated, other memory cells and their pass transistors (not illustrated) must be present. For example, an additional fuse must be present to couple the switch matrix input terminal receiving input L1 to the switch matrix output terminal transmitting output LRP3. Note that each fuse does not directly couple a switch matrix input terminal to a switch matrix output terminal. Instead, each pass transistor 111 through 141 directly couples its corresponding multiplexer 150 through 180, respectively, to its respective switch matrix output terminal. For example, memory cell 110 and its pass transistor 111 controls the coupling of the output terminal of multiplexer 150 to the switch matrix output terminal that transmits output LRP4. In turn, multiplexer 150 selects between input L1 and a test signal 145 that may be present on its two input terminals, respectively. Similarly, multiplexer 160 chooses between input L2 and test signal 145 to provide an output that pass transistor 121 may route to the switch matrix output terminal that transmits output LRP3, and so on for multiplexers 170 and 180.

A verify control signal 155 applied to another switch matrix input terminal controls multiplexers 150 through 180. In the embodiment illustrated, if verify control signal 155 is low, multiplexers 150 through 180 select their first level routing structure outputs L1 through L4, respectively. Conversely, if verify control signal 155 is high, multiplexers 150 through 180 select test signal 145 (applied to another switch matrix input terminal) to enable verification of fuses 110 through 140. During this verification, pass transistors 161 through 164 will be conducting to permit reception of the verification signals, verify result1 through verify result4. For example, when pass transistor 161 is conducting, output signal LRP1 may be received as the verification signal verify result1. Test signal 145 is weakly inverted at inverting buffers 171 through 174 and combined with outputs signals LRP1 through LRP4 to form verification signals verify result1 through verify result4, respectively. For example, suppose that memory cell 110 is configured to make pass transistor 111 conducting and that test signal 145 is set to "0." Because the test signal is only weakly pulled to "1," verify result1 should then equal "0" (the stronger output signal LRP1 overcoming the weaker inverted test signal as the two signals are combined) Conversely, should memory cell 110 be configured to make pass transistor 111 non-conducting, verify result1 should then equal "1" (the output signal LRP1 not being present to overcome the inverted test signal) In this fashion, memory cell 110 and pass transistor 111 are tested for their ability to both pass and block a "0." By setting test signal 145 to "1," memory cell 110 and pass transistor 111 may be tested for their ability to both pass and block a "1" in the same fashion. For example, suppose that memory cell 110 is configured to make pass transistor 111 conducting. Because the test signal is only weakly pulled to "0," verify result 1 should then equal "1." Conversely, should memory cell 110 be configured to make pass transistor 111 non-conducting, verify result 1 should then equal "0."

Each verification signal may be passed in parallel to a shift register 185 coupled to the switch matrix 100. The verification result signals may then be shifted out from shift register 185 analogously to boundary scan test results.

Because the total number of fuses that may be tested at any given time is the same for both the first-level routing structure and the second-level routing structure when second switch matrix 100 is fully populated, a number of components may be shared as follows by both routing structures to minimize hardware requirements.

Figures 3, 3B, 4, 5, 6:
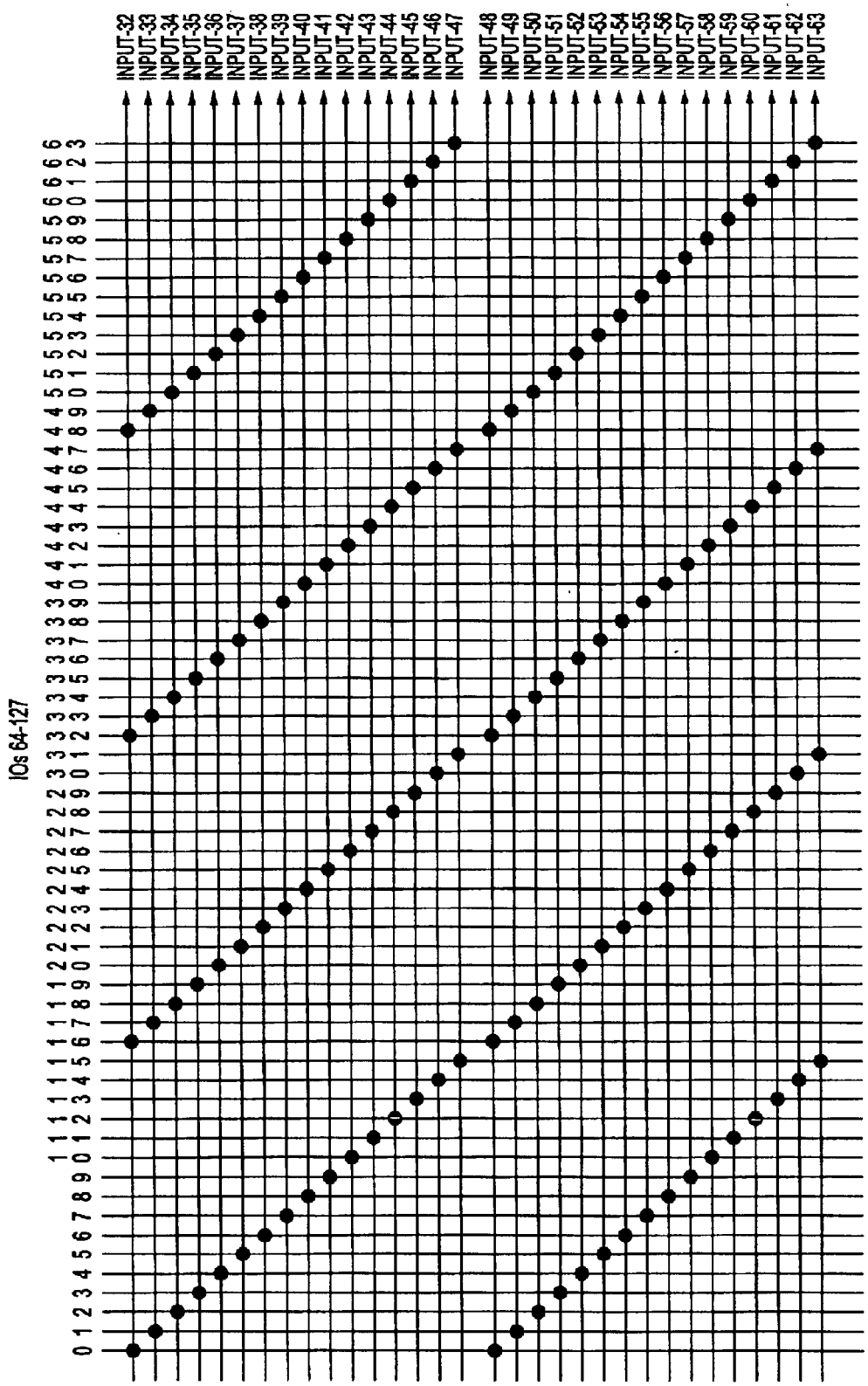

The resulting verification scheme structure for both routing structure levels is shown in FIG. 6. For illustration clarity, only a single memory cell 200 and its pass transistor 201 is shown for first-level routing structure 220, and a single fuse 210 and its pass transistor 211 is shown for second-level routing structure 230. Multiplexer 207 is the equivalent of multiplexers 150 through 180 discussed with respect to FIG. 5. Multiplexer 214 is the analog of these multiplexers for first-level routing structure 220. Thus, multiplexer 214 may select between test signal 145 and first-level routing structure data input 205. A pass transistor 215 controlled by verify control signal 155 functions analogously to pass transistors 161 through 164 as discussed with respect to FIG. 5. The control of multiplexers 214 and 207 by verify control signal 155 is not illustrated. Circuit 240 performs the weak inversion function discussed with respect to inverting buffers 171 through 174 of FIG. 5. Circuit 240 comprises switches 241 and 244. Switch 244 is configured to be open when test signal 145 equals "1" and closed when the test signal equals "1." Switch 241 is configured to be closed when test signal 145 equals "0" and open when the test signal equals "1." When switch 244 is closed and switch 241 open, the test signal is effectively pulled to ground through resistor 245. Because resistor 245 is configured to have a large resistance, e.g., 100K ohms, the test signal is only weakly pulled to ground in this case. Conversely, when switch 241 is closed and switch 244 open, the test signal is effectively pulled to VCC through resistor 246. So that the test signal is only weakly pulled to VCC, resistor 246 should also be large, e.g., 100 k ohms. If pass transistor 215 is configured to pass the output signal, the inverted test signal is combined with the output signal to form verification signal 250. If the pass transistor is configured to block the output signal, then the inverted test signal alone forms the verification signal.

To minimize hardware requirements, the sense gate structure comprising pass transistor 215, circuit 240, and shift register 185 is shared during the verification of first-level routing structure 220 and second-level routing structure 230.

2. Partially-populated Second Switch Matrix

In this case, the number of fuses that may be tested at any given time in the first-level routing structure differs from that that may be tested at any given time in the second-level routing structure. Because the second switch matrix is only partially populated, the number of its outputs, and hence the number of fuses that may be tested any given time, will be less than the number of outputs provided by the first-level routing structure. But recall that as discussed with respect to FIG. 6, it is desirable to share the sense gate structure for both routing structures to minimize hardware requirements. If, however, the verification scheme as discussed with respect to FIG. 6 is implemented for a partially-populated second switch matrix, inefficiencies will result when writing to shift register 185. This shift register must be of a size sufficient to capture the verification results during testing of the first-level routing structure. But during verification of the second-level routing structure, this shift register will be too large to efficiently capture the smaller number of verification results. As a result, the shift register could not be filled in one clock cycle but would instead capture verification results as well as null or blank results. Thus, clock cycles would have to be wasted while the blank results in the shift register were shifted out.

Figures 3, 3B, 4, 5, 6, 7:
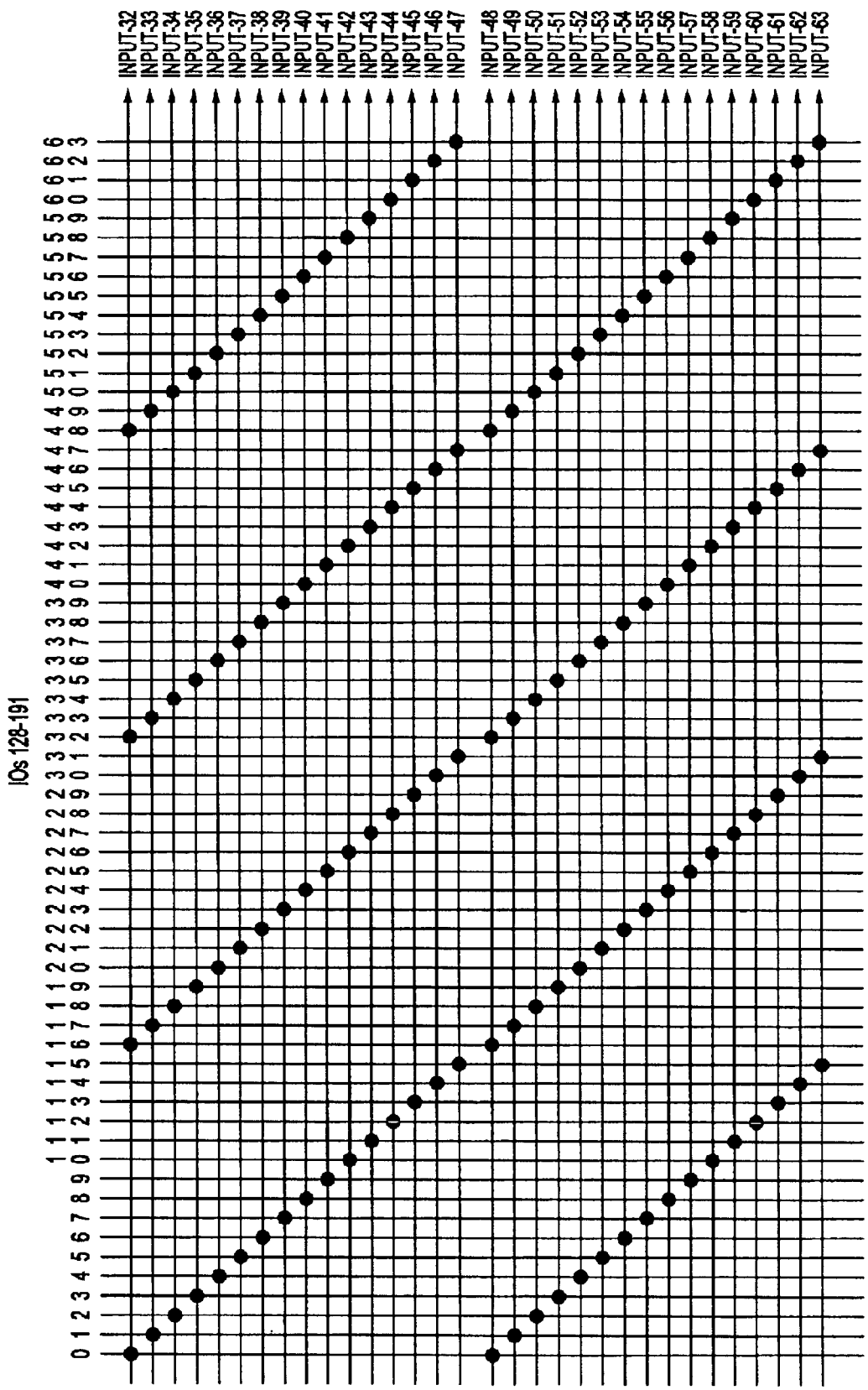

To avoid any such inefficiency, the test signal 145 is applied to the output side of each fuse/pass transistor combination for a partially-populated second switch matrix 300 as seen in FIG. 7. Outputs L1 through L4 from the first-level routing structure (not illustrated) may be routed to the second-level routing structure output terminals that transmit outputs LRP1 through LRP4 as discussed with respect to FIG. 5. For example, pass transistor 111 may couple the output terminal of bi-directional multiplexer 310 to the switch matrix output terminal that transmits LRP1. In turn, bi-directional multiplexer 310 may select for input L1 such that pass transistor 111 may ultimately route input L1 to the output terminal that transmits LRP1. Similarly, pass transistor 121 may couple the output terminal of bi-directional multiplexer 320 to the output terminal that transmits output LRP2, and so on for bi-directional multiplexer 330 and pass transistor 131, and bi-directional multiplexer 340 and pass transistor 141. In the embodiment illustrated, bi-directional multiplexers 310 through 340 will select for inputs L1 through L4, respectively, when verify control signal 155 equals "0." The verification signals verify result1 through verify result4, are weakly pulled to the opposite state of test signal 145 through inverting buffers 171 through 174 as discussed with respect to FIG. 5. In addition, test signal 145 is routed to the output side of each pass transistor 111 through 141 via tri-state buffers 341 through 344, respectively. In the embodiment illustrated, each tri-state buffer 341 through 344 is controlled by verify control signal 155 to be in the high impedance state when verify control signal 155 equals "0." Thus, the test signal 145 will not affect the state of outputs LRP1 through LRP4 during normal operation. But during verification, test signal 145 is combined with these outputsto form the corresponding verification signals verify result1 through verify result4, as follows. If memory cells 110 through 140 are configured to make their corresponding pass transistors conducting and verify control signal 155 equals "1," the state of each verification signal verify result1 through verify result4 should equal the state of test signal 145. For example, if pass transistor 111 is conducting, test signal 145 should pass through bi-directional multiplexer 310 and pass transistor 161 to overcome the output of weak inverter 171, thereby controlling the state of verify result1. Accordingly, by setting test signal 145 to either "0" or "1" and then examining the state of the verification signals, a user may test whether each memory cell/pass transistor combination can either pass or block both a "0" and a "1" analogously as discussed with respect to FIG. 5. Note the advantages of this verification scheme. Because the number of verification signals for the second-level routing structure will equal the number of its inputs, the number of verification signals is the same for both first and second-level routing structures. Accordingly, the same shift register 185 may be used in both instances.

Figures 3, 3B, 4, 5, 6, 7, 8:
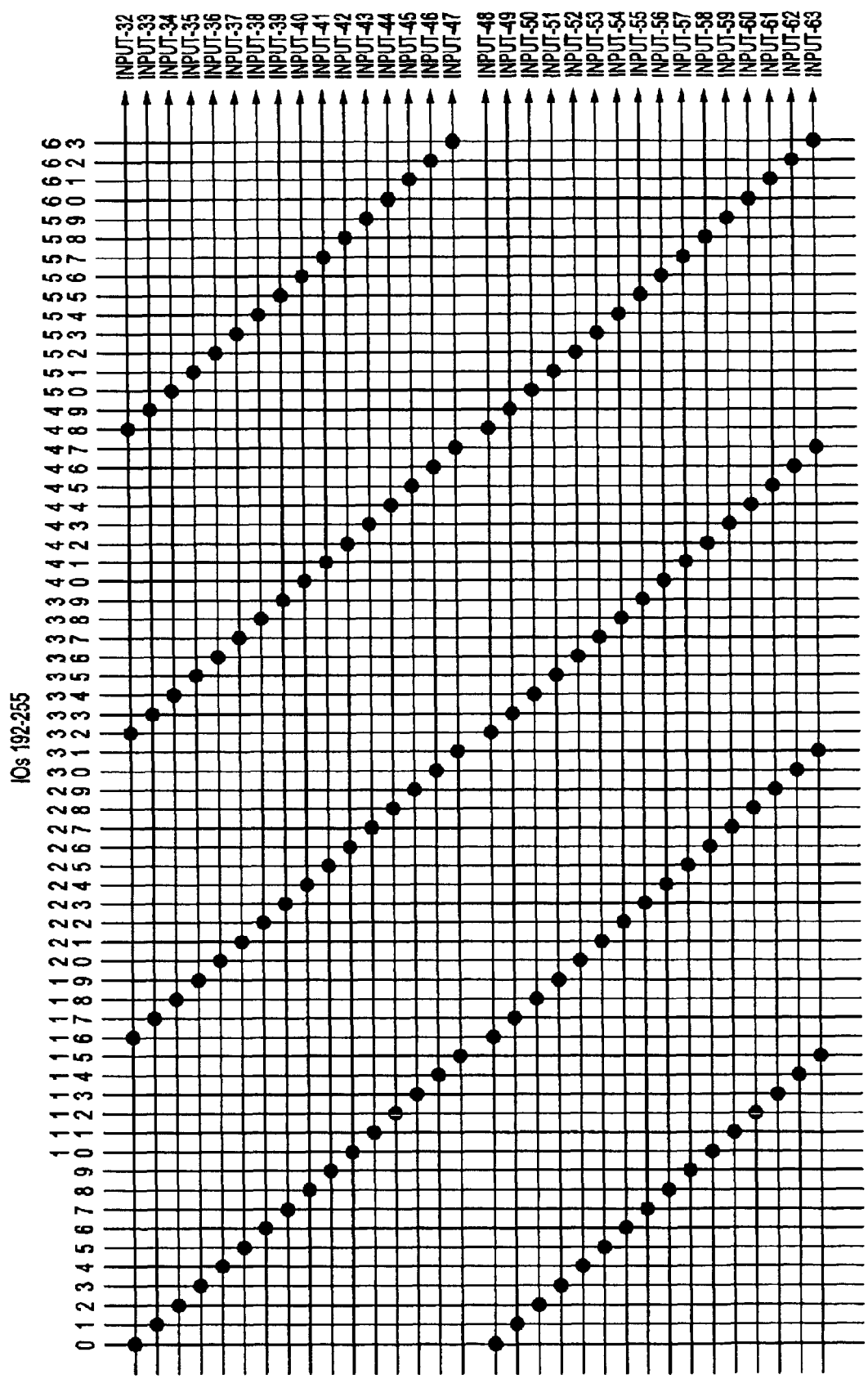
Figures 1, 3C:
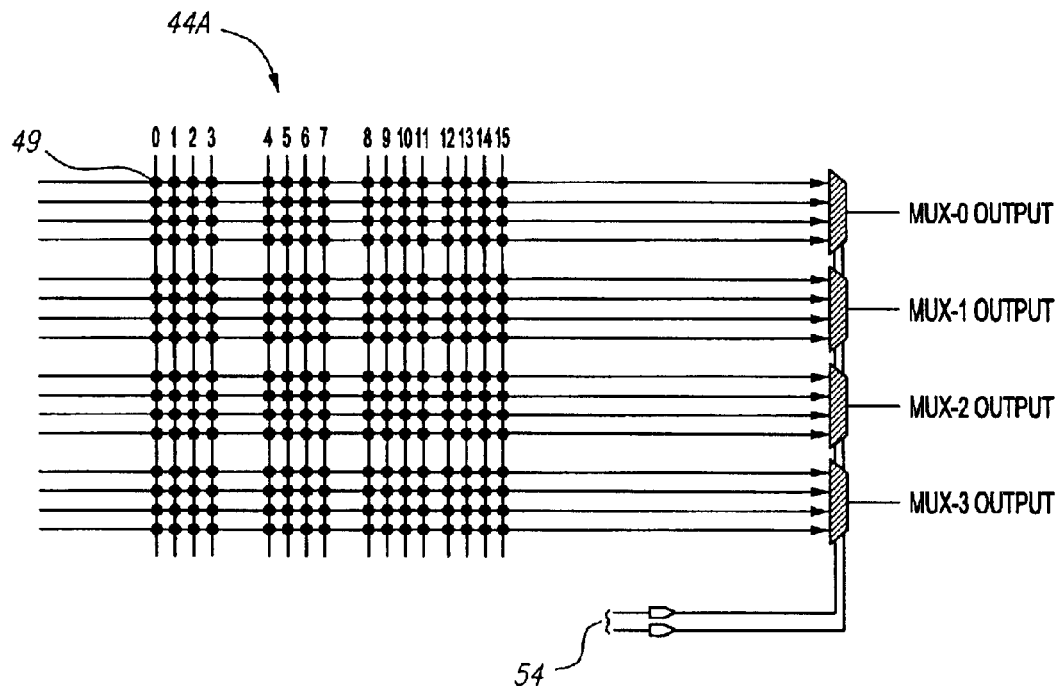
Figures 2, 3C:
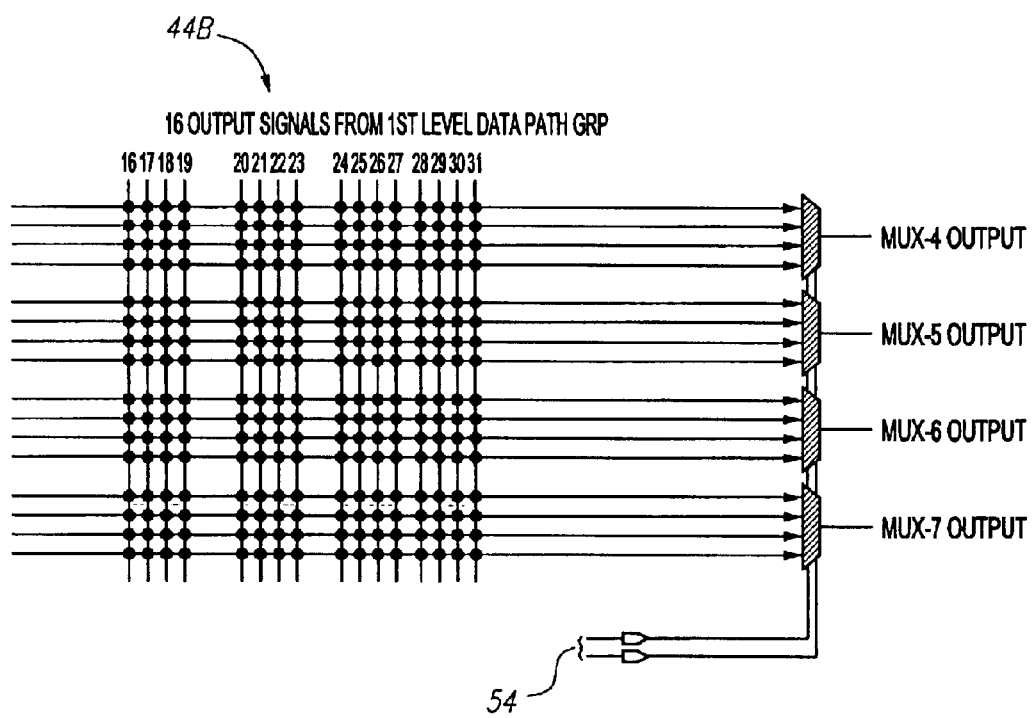
Figures 3, 3C:
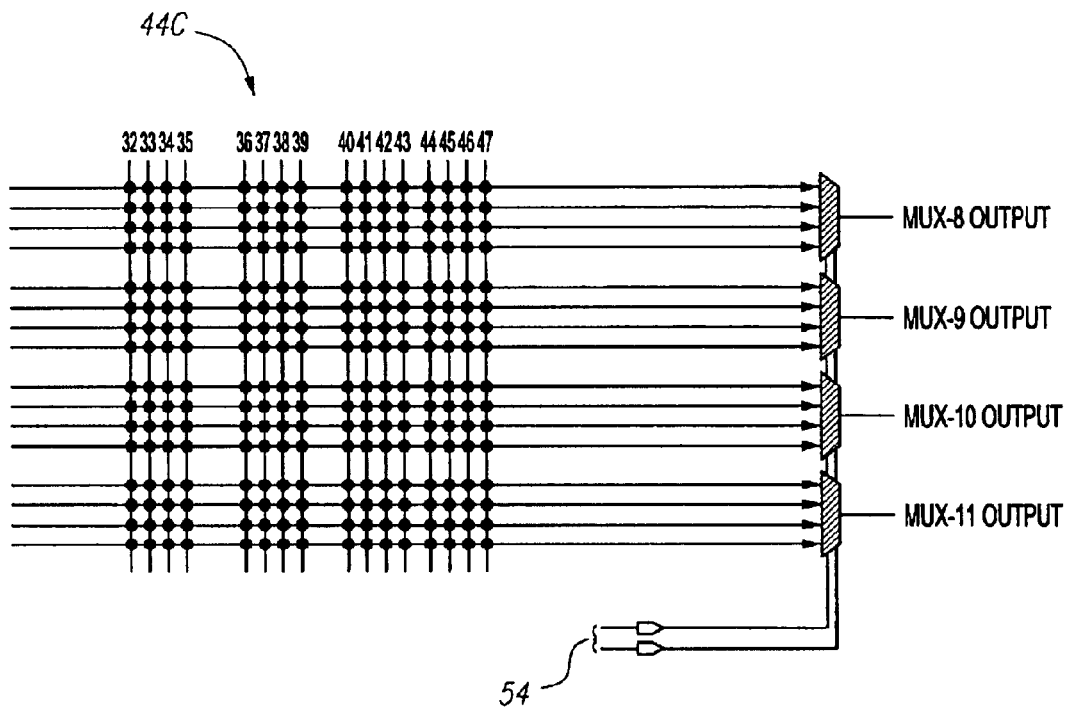
Figures 3, 3C, 4:
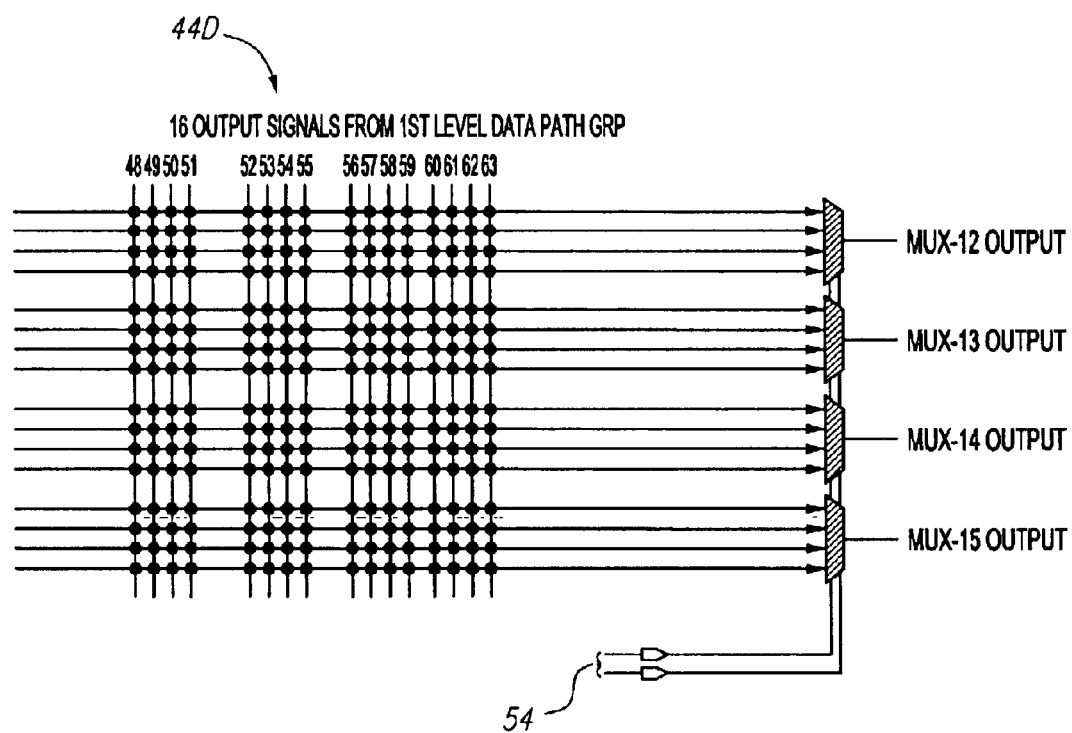

The resulting verification scheme circuitry for both routing structures is shown in FIG. 8. For illustration clarity, only a single memory cell 350 and its pass transistor 351 are shown for first-level routing structure 221. Similarly, only a single memory cell 360 and its pass transistor 361 are shown for second-level routing structure 370. The verify scheme for first-level routing structure 221 is the same as that discussed with respect to FIG. 6. Thus, multiplexer 212 selects between first-level routing structure input 206 and test signal 145. Memory cell 350 controls whether pass transistor 351 allows the output of multiplexer 212 to pass to second-level routing structure 370 and the verification signal output terminal. Verify control signal 155 controls multiplexer 212. During verification, multiplexer 212 selects test signal 145 (this is the mode illustrated). During normal operation, multiplexer 212 selects data input 206. Pass transistor 351 may then pass this data input to second-level routing structure 370 as output L5. In this user mode, bi-directional multiplexer 380 (as controlled by verify control signal 155) selects for output L5 and provides this output to pass transistor 361. In turn, the output of pass transistor 361 becomes second-level routing structure output 395. Thus, during normal operation data input 206 may form data output 395. But during verification, test signal 145 does not enter second-level routing structure 370 through bi-directional multiplexer 380 in this fashion. Instead, test signal 145 passes to the output side of pass transistor 361 through tri-state buffer 390. Thus, this approach may be denoted as a "reverse" verify scheme as opposed to the "regular" verify scheme used for the first-level routing structure 221. The verify control signal 155 controls tri-state buffer 390 to be in the high impedance state during normal operation so that test signal 145 will not form data output 395 at that time. During verification, multiplexer 380 passes test signal 145 as received from the input side of pass transistor 361 to pass transistor 215. In turn, the resulting verification signal 250 passes to shift register 185 as described previously. Thus, for every output signal from first-level routing structure 221 (e.g., signal L5), second-level routing structure 370 produces a corresponding verification signal. In this manner, the number of fuses tested for either routing structure is the same. Advantageously, the same sense gate structure (comprising pass transistor 215, circuit 240 and shift register 185 in this embodiment) may then be used for both routing structures 221 and 370. Moreover, the same sense gate structure may be used to verify a system having two independent two-level routing structures, such as the data-pass routing structure and control-pass routing structure described previously.

Figure 9:
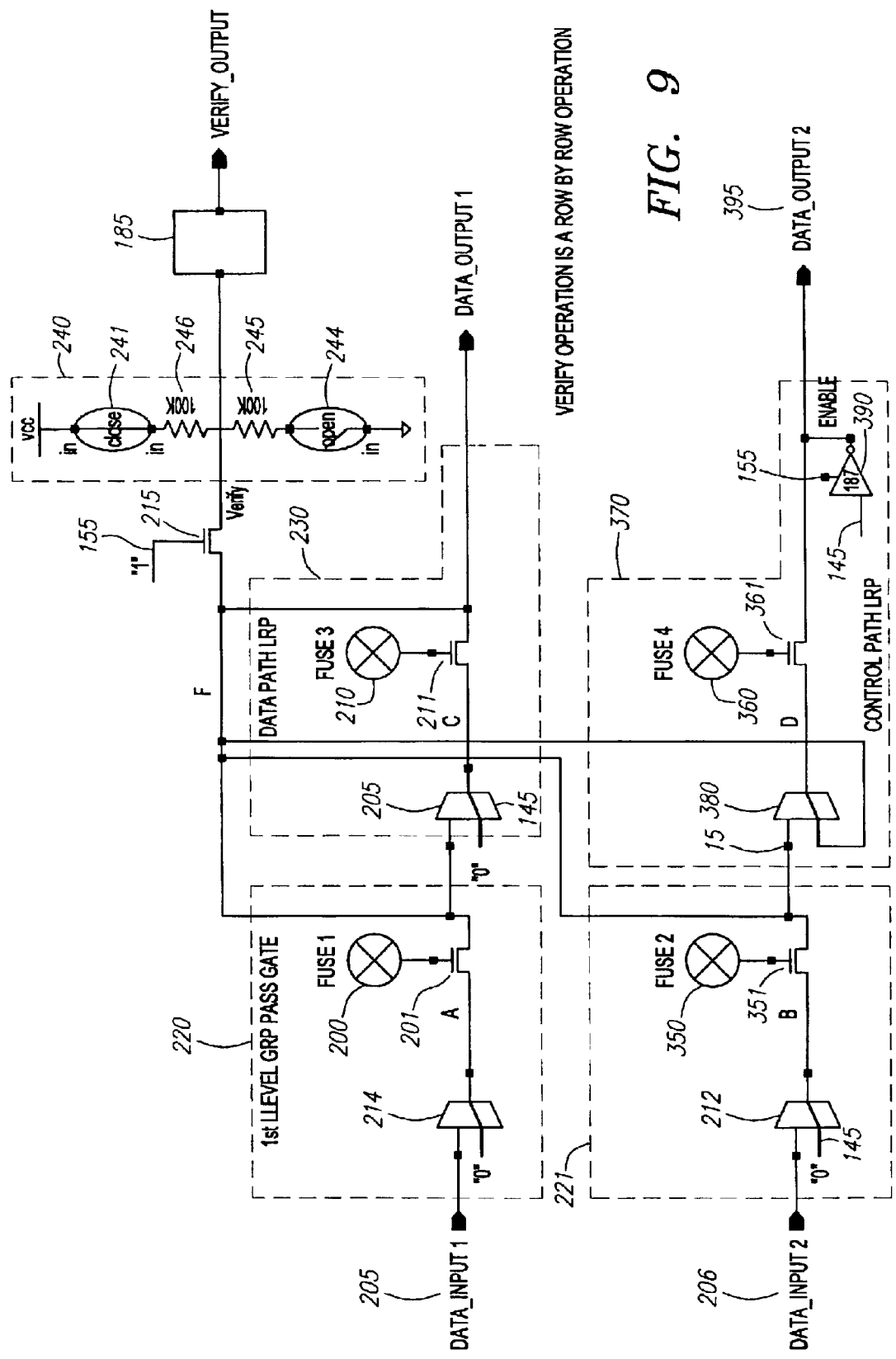
FIG. 9 illustrates a verify circuit for a two-level routing structure according to one embodiment of the invention.

In FIG. 9, routing structures 220, 230, 221, and 370 are as described with respect to FIGS. 6 and 8. In the embodiment illustrated, multiplexers 215, 205, 212, and bi-directional multiplexer 380 are in the verification mode. Thus, multiplexers 215, 205, and 212 select for test signal 145. Bi-directional multiplexer 380 selects for test signal 145 through pass transistor 361. Note that each routing structure will provide the same number of verification signals (and hence test the same number of fuses) during each test cycle. Thus, the same sense structure (represented by pass transistor 215, circuit 240, and shift register 185) may be used to verify all four routing structures.

It will be appreciated that the "reverse" verify scheme discussed with respect to a partially-populated second-level switch matrix may be implemented for a first-level routing structure as well. For example, the labeling of inputs L1 through L4 in FIG. 7 as the outputs of a first-level routing structure is entirely arbitrary. These inputs could also be considered the inputs to a first-level routing structure. Similarly, outputs LRP1 through LRP4 may also be considered the outputs of a first-level routing structure. As compared to the "regular" verify scheme discussed with respect to FIG. 5, this "reverse" approach requires the extra hardware of tri-state buffers 341 through 344. However, other design considerations besides minimizing hardware requirements may favor a "reverse" approach for certain first-level routing structures. Similarly, if the second switch matrix in a second-level routing structure is fully populated, either the "reverse" or "regular" verify schemes may be implemented. However, if the second switch matrix is partially populated, the "reverse" verify scheme should be implemented so that the same sense gate structure may be used for both levels of the routing structure.

Accordingly, although the invention has been described with respect to particular embodiments, this description is only an example of the invention's application and should not be taken as a limitation. For example aspects of the invention can be used in a single-level routing structure as well. Consequently, the scope of the invention is set forth in the following claims.

What is claimed is:

1. A multi-level routing structure embedded within a programmable device, comprising:
    a first-level routing structure configurable to, in a user mode, receive a first set of input signals and route the first set of input signals through a first switch matrix to form a first set of output signals and to, in a verify mode, route a test signal through the first switch matrix to form the first set of output signals;
    a second-level routing structure configurable to, in the user mode, receive the first set of output signals and route the first set of output signals through a second switch matrix to form a second set of output signals and to, in the verify mode, route the test signal through the second switch matrix to form the second set of output signals; and
    a sense gate operable in the verify mode to receive the first set of output signals or the second set of output signals and form there from a set of verification signals.

2. The multi-level routing structure of claim 1, wherein the first switch matrix comprises a first set of fuses, and wherein each fuse controls a corresponding pass transistor.

3. The multi-level routing structure of claim 2, wherein the first-level routing structure further comprises:
    a first set of multiplexers corresponding to the first set of fuses, wherein each multiplexer is configured to provide the test signal to its corresponding fuse's pass transistor in the verify mode, and is configured to provide a signal from the first set of input signals to its corresponding fuse's pass transistor in the user mode.

4. The multi-level routing structure of claim 3, wherein the second switch matrix comprises a second set of fuses, and wherein each fuse in the second set of fuses controls a corresponding pass transistor.

5. The multi-level routing structure of claim 4, wherein the second-level routing structure further comprises:
    a second set of multiplexers corresponding to the second set of fuses, wherein each multiplexer in the second set is configured to provide the test signal to its corresponding fuse's pass transistor in the verify mode, and is configured provide a signal from the first set of output signals to its corresponding fuse's pass transistor in the user mode.

6. The multi-level routing structure of claim 1, wherein the first switch matrix is partially populated.

7. The multi-level routing structure of claim 1, wherein the sense gate includes a shift register operable to receive in parallel the set of verification signals.

8. The multi-level routing structure of claim 2, wherein each fuse in the first set of fuses comprises an electrically erasable memory cell.

9. The multi-level routing structure of claim 4, wherein each fuse in the second set of fuses comprises an electrically erasable memory cell.

10. The multi-level routing structure of claim 1, wherein the second switch matrix is fully populated.

11. A multi-level routing structure embedded within a programmable device, comprising:
    a first-level routing structure configurable to, in a user mode, receive a first set of input signals and route the set of input signals through a first switch matrix to form a first set of output signals and to, in a verify mode, route a test signal through the first switch matrix to form the first set of output signals;
    a second-level routing structure configurable to, in the user mode, receive the first set of output signals and route the first set of output signals through a partially-populated second switch matrix to form a second set of output signals and to, in the verify mode, route the test signal through the second switch matrix to form a third set of output signals, wherein the size of the third set of output signals equals the size of the first set of output signals, and
    a sense gate operable in the verify mode to receive the first set of output signals or the third set of output signals and form there from a set of verification signals.

12. The multi-level routing structure of claim 11, wherein the first switch matrix comprises a first set of fuses, and wherein each fuse controls a corresponding pass transistor.

13. The multi-level routing structure of claim 11, wherein the second switch matrix comprises a set of fuses, and wherein each fuse in the second set of fuses controls a corresponding pass transistor having an input side for receiving a signal from the first set of output signals and an output side for producing a signal from the second set of output signals.

14. The multi-level routing structure of claim 13, wherein the second-level routing structure further comprises:
    a set of tri-state buffers corresponding to the set of fuses, wherein each tri-state buffer is configured to provide the test signal to the output side of its corresponding fuse's pass transistor in the verify mode.

15. The multi-level routing structure of claim 14, wherein the second-level routing structure is configured to route the test signal into a third set of output signals in the verify mode and is configured to route the first set of output signals through the second switch matrix into the second set of output signals in the user mode by further comprising:
    a set of bi-directional multiplexers corresponding to the set of fuses, wherein in the verify mode, each bi-direction multiplexer is configured to receive the test signal from the input side of its corresponding fuse's pass transistor and thereby provide a signal in the third set of output signals, and wherein in the user mode, each bi-directional multiplexer is configured to select a signal from the first set of output signals and provide the selected signal to the input side of its corresponding fuse's pass transistor.

16. The multi-level routing structure of claim 10, wherein the sense gate includes a shift register for receiving in parallel the set of verification signals.

17. A routing structure embedded within a programmable device, comprising:
    a switch matrix configurable, in a user mode, to receive a set of input signals and route the signals through the matrix to form a set of output signals and operable, in a verify mode, to receive a test signal and route the test signal through the matrix to form the set of output signals;
    a set of pass transistors within the switch matrix, each pass transistor having and input side and an output side and configurable in the user mode to pass or block an input signal from the input side to the output side and configurable in the verify mode to pass or block a test signal from the output side to the input side;

a set of tri-state buffers within the switch matrix, each tri-state buffer coupled to an output side of a pass transistor and operable in the verify mode to pass the test signal to the transistor output side; and a sense gate coupled to the switch matrix and operable in the verify mode to receive the set of output signals from the switch matrix and form there from a set of verification signals.

18. The routing structure of claim 17 including a set of bi-directional multiplexers within the switch matrix, each bi-directional multiplexer coupled to the input side of a pass transistor and operable in the user mode to pass an input signal to the transistor input side and operable in the verify mode to receive the test signal from the transistor input side.

19. A routing structure embedded within a programmable device, comprising:

a switch matrix configurable, in a user mode, to receive a set of input signals and route the signals through the matrix to form a set of output signals and operable, in a verify mode, to receive a test signal and route the test signal through the matrix to form the set of output signals;

a set of pass transistors within the switch matrix, each pass transistor having and input side and an output side and configurable in the user mode to pass or block an input signal from the input side to the output side and configurable in the verify mode to pass or block a test signal from the output side to the input side; and a set of bi-directional multiplexers within the switch matrix, each bi-directional multiplexer coupled to the input side of a pass transistor and operable in the user mode to pass an input signal to the transistor input side and operable in the verify mode to receive the test signal from the transistor input side; and a sense gate coupled to the switch matrix and operable in the verify mode to receive the set of output signals from the switch matrix and form there from a set of verification signals.

20. The routing structure of claim 19 wherein the sense gate comprises:

a set of inverters coupled at their input terminal to a source of the test signal and at their output terminals to output terminals of the switch matrix, the inverters operable to weakly invert the test signal and combine the inverted test signal with the received set of output signals to form a set of verification signals; and a shift register operable to capture and shift the verification signals.

21. The routing structure of claim 20 wherein the switch matrix is partially populated.

* * * * *